(12) United States Patent
Kinoshita et al.

(10) Patent No.: US 7,863,927 B2
(45) Date of Patent: Jan. 4, 2011

(54) SEMICONDUCTOR DEVICE

(75) Inventors: Hiroshi Kinoshita, Itami (JP); Mitsuo Magane, Tokyo (JP)

(73) Assignee: Renesas Electronics Corporation, Osaka (JP)

( * ) Notice: Subject to any disclaimer, the term of this patent is extended or adjusted under 35 U.S.C. 154(b) by 5 days.

(21) Appl. No.: 12/392,517

(22) Filed: Feb. 25, 2009

(65) Prior Publication Data

US 2009/0243748 A1     Oct. 1, 2009

(30) Foreign Application Priority Data

Mar. 31, 2008    (JP) .............................. 2008-091534

(51) Int. Cl.
*H03K 17/16*    (2006.01)
*H03K 19/003*   (2006.01)

(52) U.S. Cl. ........................... 326/30; 326/86; 327/109
(58) Field of Classification Search ..................... 326/30
See application file for complete search history.

(56) References Cited

U.S. PATENT DOCUMENTS

| | | | | |
|---|---|---|---|---|
| 6,064,224 | A * | 5/2000 | Esch et al. | 326/30 |
| 6,141,258 | A | 10/2000 | Kawasumi | |
| 6,414,525 | B2 * | 7/2002 | Urakawa | 327/112 |
| 6,762,620 | B2 * | 7/2004 | Jang et al. | 326/30 |
| 6,937,055 | B2 * | 8/2005 | Roy et al. | 326/30 |
| 7,573,289 | B2 * | 8/2009 | Kim et al. | 326/30 |
| 7,642,808 | B2 * | 1/2010 | Jeong et al. | 326/30 |
| 7,656,186 | B2 * | 2/2010 | Osanai et al. | 326/30 |
| 2004/0008054 | A1 * | 1/2004 | Lesea et al. | 326/30 |
| 2005/0040845 | A1 * | 2/2005 | Park | 326/30 |
| 2006/0158198 | A1 * | 7/2006 | Fujisawa | 324/601 |
| 2006/0261844 | A1 | 11/2006 | Kim et al. | |
| 2007/0146004 | A1 * | 6/2007 | Park et al. | 326/30 |
| 2008/0001623 | A1 * | 1/2008 | Kim | 326/30 |
| 2008/0048714 | A1 * | 2/2008 | Lee et al. | 326/30 |

FOREIGN PATENT DOCUMENTS

| | | |
|---|---|---|
| JP | 11-027132 | 1/1999 |
| JP | 2000-183718 | 6/2000 |
| JP | 2001-101881 | 4/2001 |
| JP | 2004-032070 | 1/2004 |
| JP | 2006-319968 | 11/2006 |

* cited by examiner

*Primary Examiner*—James H. Cho
*Assistant Examiner*—Jason M Crawford
(74) *Attorney, Agent, or Firm*—McDermott Will & Emery LLP

(57) ABSTRACT

The present invention is directed to adjust a resistance value of an output buffer on the basis of a resistance value of an external resistor. A potential according to a resistance ratio between an external resistor and each of resistance adjusters is detected by a code generator. In the code generator, code signals for adjusting resistance are adjusted in accordance with the detection result. The resistance value of each of the resistance adjusters is adjusted to an external resistor. Further, by code signals with which the resistance value of each of the resistance adjusters is adjusted to the resistance value of the external resistor, the resistance of the resistance value of an output buffer is adjusted.

8 Claims, 22 Drawing Sheets

FIG. 12

|  | DR2-1 240 Ω ADJUSTER | DR2-2 120 Ω ADJUSTER | DR2-3 60 Ω ADJUSTER |
|---|---|---|---|
| 240 Ω | ○ | × | × |
| 120 Ω | × | ○ | × |
| 80 Ω | ○ | ○ | × |
| 60 Ω | × | × | ○ |
| 48 Ω | ○ | × | ○ |
| 40 Ω | × | ○ | ○ |
| 34.2 Ω | ○ | ○ | ○ |

SEMICONDUCTOR DEVICE

CROSS-REFERENCE TO RELATED APPLICATIONS

The disclosure of Japanese Patent Application No. 2008-91534 filed on Mar. 31, 2008 including the specification, drawings and abstract is incorporated herein by reference in its entirety.

BACKGROUND OF THE INVENTION

The present invention relates to a semiconductor device having an output buffer whose impedance is adjustable.

In recent years, the speed of data communication between semiconductor devices is increasing, so that reflection noise occurring at the time of high-speed communication has to be reduced. Impedance adjusting methods for adjusting the impedance of an output buffer with respect to a resistance value of an external resistor are being developed.

For example, patent document 1 (Japanese Unexamined Patent Application Publication No. 2000-183718) discloses a method of adjusting the impedance of an output buffer to the resistance value of an external resistor.

In FIG. 1 of the patent document 1, the impedance of a pull-down output buffer is adjusted to an integral multiple of the resistance value of an external resistor using information when the pull-down counter adjusts the total channel width to the resistance value of the external resistor by on/off control of a plurality of transistors configuring the impedance of a pull-down dummy buffer. Using information when a pull-up counter adjusted the impedance of a pull-up dummy buffer, the impedance of the pull-up output buffer is adjusted to an integral multiple of the resistance value of the external resistor. For the adjustment of the impedance of the pull-up dummy buffer by the pull-up counter, information of the operation of adjusting the pull-down counter is used.

For example, patent document 2 (Japanese Unexamined Patent Application Publication No. 2006-319968) discloses an impedance control circuit and its control method capable of reducing resistance mismatch between a pull-up device and a pull-down device.

Concretely, to compensate a quantizing error in pull-up and pull-down control code data, by providing a compensation unit in an output driver, resistance mismatch between the pull-up device and the pull-down device is reduced.

SUMMARY OF THE INVENTION

The impedance of the output buffer in the patent document 1 is limited to the integral multiple of the resistance value when the pull-down counter adjusts a pull-down dummy buffer to the resistance value of the impedance of an external resistor.

Further, since the total channel width is adjusted by the on/off control on a plurality of transistors, variations in the channel width of the transistors exerts an influence on adjustment of impedance of the output buffer, and an error occurs in the impedance.

In the Patent document 2 (Japanese Unexamined Patent Application Publication No. 2006-319968), to compensate a quantizing error, a compensation unit is disposed in an output driver, so that the circuit area increases.

Therefore, an object of the present invention is to provide an impedance adjusting method capable of adjusting a resistance value on the basis of an external resistor and a semiconductor device having an output buffer whose impedance can be adjusted.

Another object of the invention is to provide an impedance adjusting method capable of adjusting two resistance values on the basis of one external resistor and a semiconductor device having an output buffer whose impedance can be adjusted.

Further another object of the invention is to provide an impedance adjusting method realizing a reduced error between an external resistance value and an adjusted resistance value and a semiconductor device having an output buffer whose impedance can be adjusted.

Further another object of the invention is to provide a semiconductor device having an output buffer whose impedance can be adjusted with a circuit configuration of a small area.

In a semiconductor device as an embodiment of the present invention, a potential determined by a resistance ratio between an external resistor and resistance adjusters is detected by a code generator. The code generator adjusts a code signal for resistance adjustment in accordance with the detection result and adjusts the resistance value of each of the resistance adjusters to the external resistance. Further, by the code signal by which the resistance value of each of the resistance adjusters is adjusted to the resistance value of the external resistor, the resistance value of the output buffer is adjusted.

In the semiconductor device of the embodiment, by adjusting the resistance value of an output buffer with the code signal, the resistance value can be adjusted to the resistance value of the external resistor.

BRIEF DESCRIPTION OF THE DRAWINGS

FIG. 12 is a diagram showing resistance values of an output driver DR2 which can be realized by combination of on/off states of drivers DR2-1 to DR2-3.

DETAILED DESCRIPTION OF THE PREFERRED EMBODIMENTS

In high-speed IF such as DDR, output driver impedance (output resistance) for suppressing noise, reflection, and the like occurring at the time of data transfer and the impedance of a termination resistor coupled to a transmission line have to be matched. In practice use, however, the impedance of the output driver on the chip side fluctuates due to PVT (process, voltage, and temperature) fluctuations, it is difficult to obtain matching and it causes noise and reflection. A calibration circuit generates an internal reference resistance of the same resistance value as that of the external resistor to make the impedance of the output driver constant regardless of the PVT fluctuations, and outputs a control signal so that the resistance value becomes the same as that of the external resistor.

Figure 1:
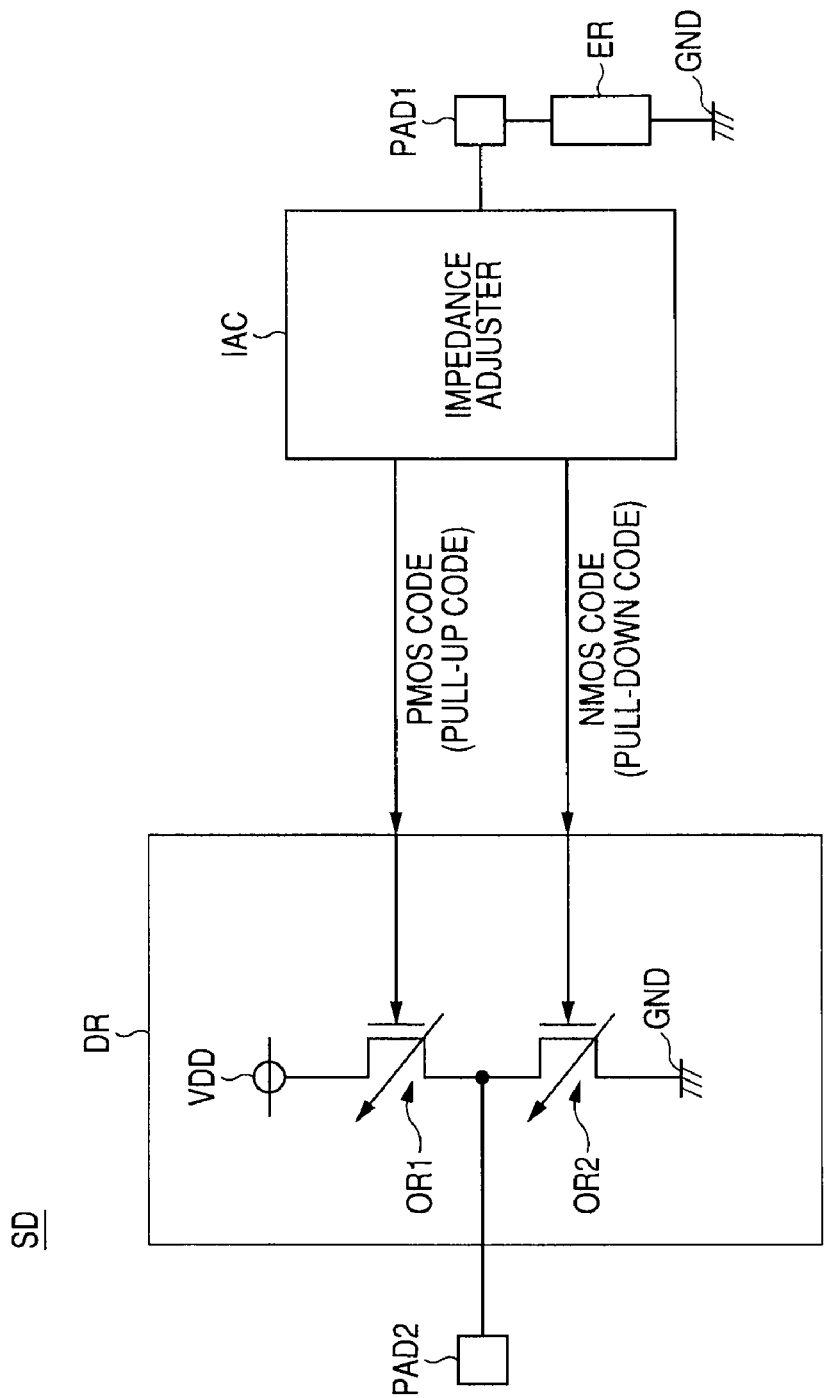
FIG. 1 is a schematic diagram of a semiconductor device SD according to the present invention.

FIG. 1 is a schematic diagram of a semiconductor device SD according to the present invention. The semiconductor device SD generates internal reference resistance of the same resistance value as that of an external resistor ER by an impedance adjuster IAC on the basis of the external resistor ER. The resistance value of the internal reference resistance is adjusted to the resistance value of the external resistor ER by adjusting code signals (PMOSCODE and NMOSCODE) generated by the impedance adjuster IAC.

Further, using the code signals generated when the resistance value of the internal reference resistance is adjusted to the resistance value of the external resistor ER, the resistance value of each of output resistors OR1 and OR2 configuring an output driver DR is adjusted to be equal to the resistance value of the external resistor ER.

In each of the internal reference resistor and the output resistors OR1 and OR2, for example, two sets each made by a resistive element and a MOS transistor which are coupled to each other in series (resistance adjusting element) are coupled to each other in parallel. By switching the on/off state of the MOS transistors by using a code signal, the resistance value is adjusted. In the following embodiments, the output driver DR will be omitted and the impedance adjuster IAC will be mainly described.

First Embodiment

Figure 2:
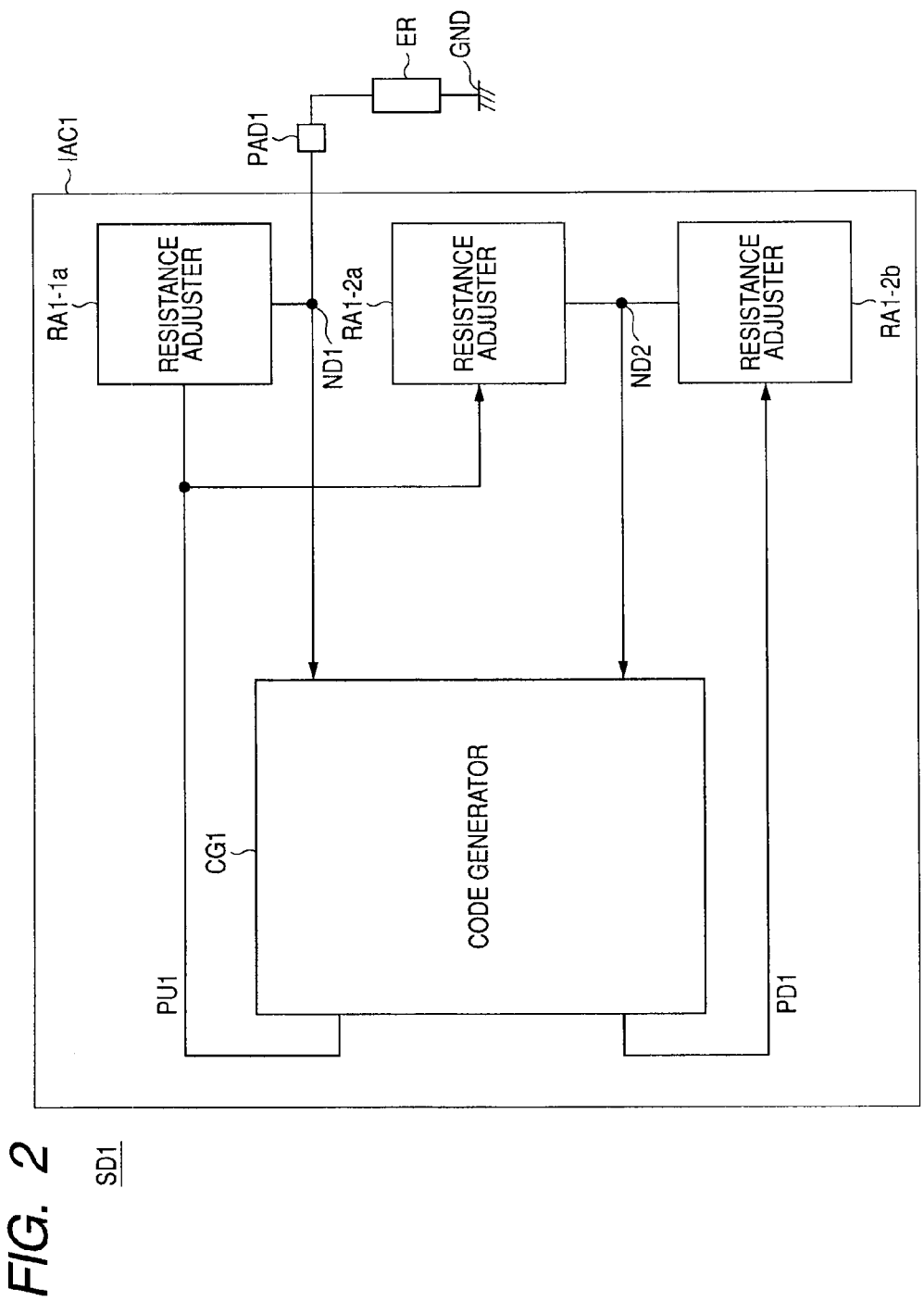
FIG. 2 is a schematic diagram of a semiconductor device SD1 as a first embodiment.

FIG. 2 is a schematic diagram of a semiconductor device SD1 as a first embodiment. The semiconductor device SD1 includes an impedance adjuster IAC1 and an external resistor ER. The impedance adjuster IAC1 has a pad PAD1 for coupling the external resistor, resistance adjusters RA1-1a, RA1-2a, and RA1-2b, and a code generator (code adjuster) CG1.

In the embodiment, the code generator CG1 compares potential of a node ND1 determined by a resistance ratio between the external resistor (reference resistor) ER and the resistance adjuster RA1-1a with a reference potential, generates a code signal (pull-up code PU1) according to a comparison result, and adjusts the resistance values of the resistance adjusters in accordance with the code signal. The code generator CG1 adjusts the resistance value of the resistance adjuster RA1-2a by using the code signal used for adjustment of the resistance value of the resistance adjustor RA1-1a. Further, the code generator CG1 adjusts the resistance value of the resistance adjustor RA1-2b on the basis of a code signal (pull-down code PD1). The pull-down code PD1 is generated, in the code generator CG1, in accordance with a result of comparison between the potential at a node ND2 determined by the resistance ratio between the resistance adjustors RA1-2a and RA1-2b with reference potential.

By using the code signals set as described above, the resistance value of the output driver is adjusted (refer to FIG. 1). Concrete circuit configurations and operations will now be described.

Figure 3:
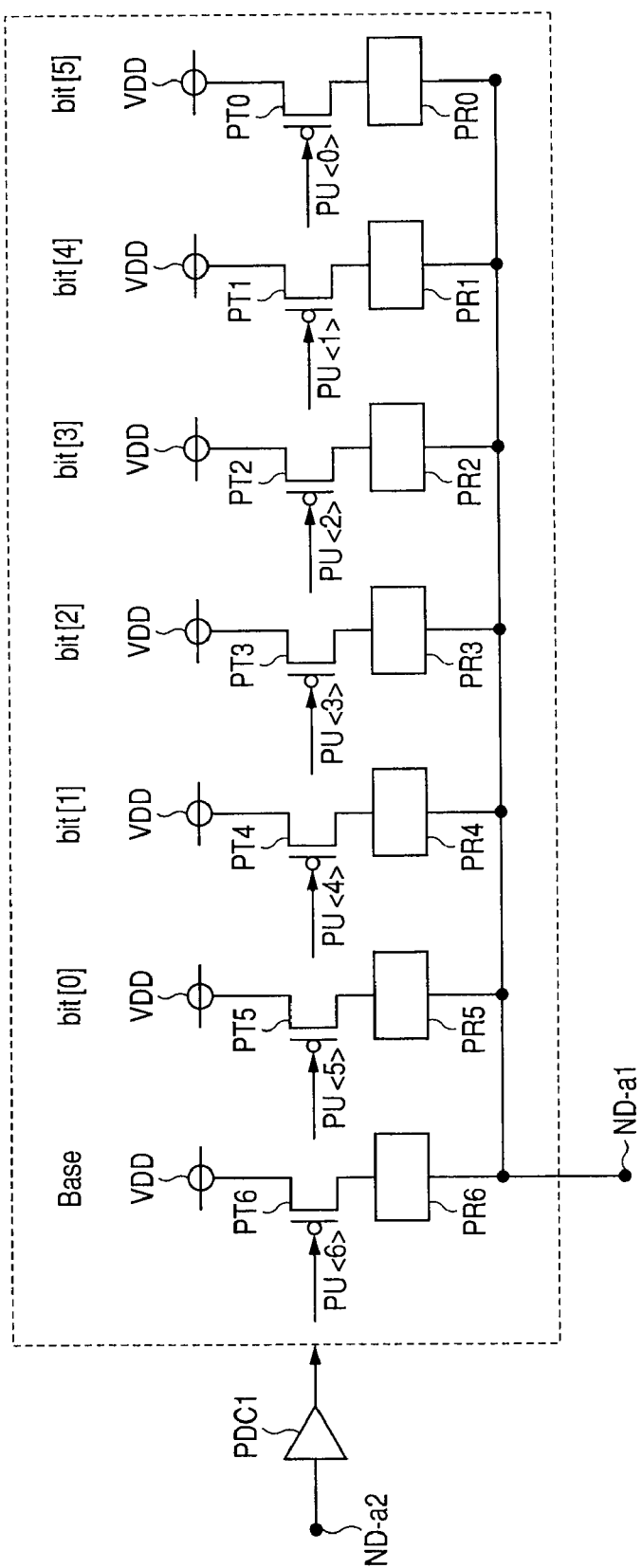
FIG. 3 is a diagram showing the configuration of a first-type resistance adjuster RA-a.

FIG. 3 shows the configuration of a first-type resistance adjuster RA-a. The resistance adjusters RA1-1a and RA1-2a shown in FIG. 2 have the configuration of the first-type resistance adjuster RA-a. As an example, the first-type resistance adjuster RA-a has a 7-bit configuration. In the following, resistance adjusters RAx-ya and RAx-yaz (where no resistance adjustor corresponds to first resistance adjuster RA-a.

The first-type resistance adjuster RA-a has 7 sets (7 bits) made of P-channel MOS transistors PT0 to PT6 (also written as PTn) and resistive elements PR0 to PR6 (also written as PRn) coupled between power source voltage VDD and a node ND-a1. When the node ND-a1 is the resistance adjuster RA1-1a in FIG. 1, it is coupled to the node ND1. When the node ND-a1 is the resistance adjuster RA1-2a, it is coupled to the node ND2. The first-type resistance adjuster RA-a also has a pre-driver circuit PDC1 which receives the pull-up code PU1 and on-off (conduction state-non-conduction state) drives the P-channel MOS transistors PTn.

The resistance value of the first-type resistance adjuster RA-a is adjusted by the pull-up code PU1 input from a node ND-2a. The pull-up code PU1 is entered to corresponding bits by the pre-driver circuit PDC1. The case where the P-channel MOS transistor PT6 as the base is set always "on" and the pull-up code PU1 is made of six bits will be described.

The resistance adjustment in the first-type resistance adjuster RA-a is performed by turning on/off, bit by bit, the corresponding P-channel MOS transistors PT0 to PT5 by the pull-up code PU1 (PU<0> to PU<5>) entered to the six bits of bit [0] to bit [5]. The bit (the P-channel MOS transistor PT6) of the base to which the pull-up code PU<6> is entered is always turned on.

For example, when the pull-up codes PU<0> to PU<5> input to the bits bit[0] to bit[5] are at the high level, the P-channel MOS transistors PT0 to PT5 are turned off, and a resistance value of only the base bit is obtained. On the other hand, when the pull-up codes PU<0> to PU<5> input to the bits bit[0] to bit[5] are at the low level, the P-channel MOS transistors PT0 to PT5 are turned on, thereby obtaining a combined resistance value of resistance in the bits.

The gate length of the P-channel MOS transistor PTn used is selected in consideration of process fluctuations and ESD. As the resistive element PRn, an element having process fluctuations and temperature dependency as small as possible is used. In the embodiment, when the pull-up code P<n> is 0, the P-channel MOS transistor PTn is off. When the pull-up code P<n> is 1, the P-channel MOS transistor PTn is on.

Figure 4:
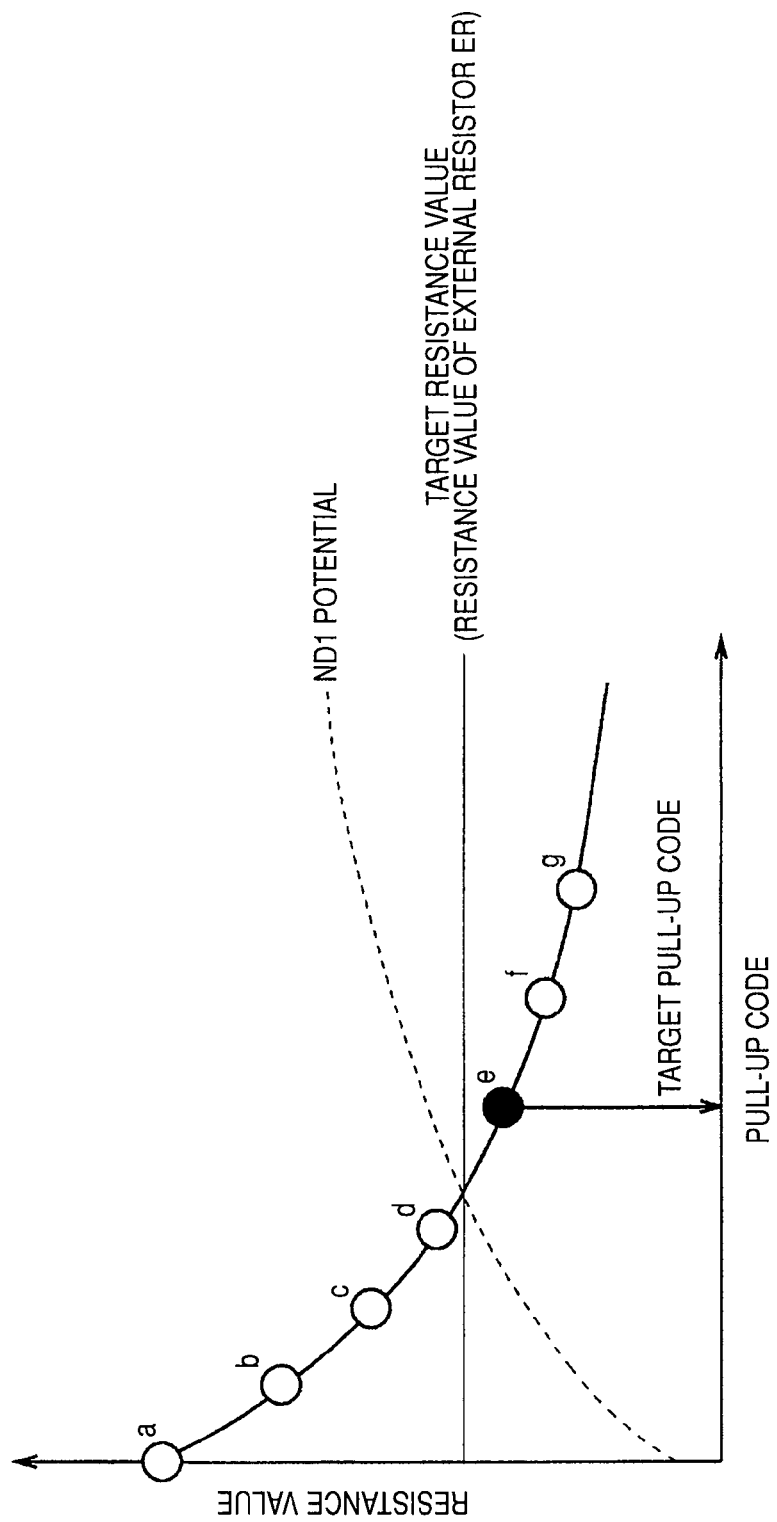
FIG. 4 is a diagram showing the relation between a pull-up code PU and a combined resistance value of the first resistance adjuster RA-a.

FIG. 4 is a graph showing the relation between the pull-up code PU1 and the combined resistance value of the set of the P-channel MOS transistor PTn and the resistive element PRn configuring the first resistance adjuster RA1 (the resistance adjuster R1-1a). The horizontal axis indicates the pull-up code PU1 and the vertical axis indicates the resistance value.

The impedance adjuster IAC in FIG. 1 compares the resistance value of the external resistor ER with the resistance value in the case of changing the pull-up code PU1 (of the P-channel MOS transistor PTn and the resistive element PRn) of the first resistance adjuster RA1 in the semiconductor device SD1 from small to large values (in FIG. 4, a→b→c→d→e→f→g). The impedance adjuster IAC outputs a detection signal at the time point ("e" in the diagram) when the resistance value of the resistance adjuster RA1 becomes smaller than that of the external resistor ER for the first time. The code at this time becomes a target pull-up code.

The size is adjusted so that the combination of the P-channel MOS transistor PTn and the resistive element PRn has continuity (monotonicity) as shown in FIG. 4.

When the first resistance adjuster RA1 performs the above-described resistance adjustment, the second resistance adjuster RA2 (the resistance adjuster RA1-2a) also performs similar resistance adjustment. The second resistance adjuster RA2 has a configuration similar to that of the first resistance adjuster RA1, receives the same pull-up code PU<6:0>, and its resistance value is adjusted to the resistance value of the external resistor ER.

Figure 5:
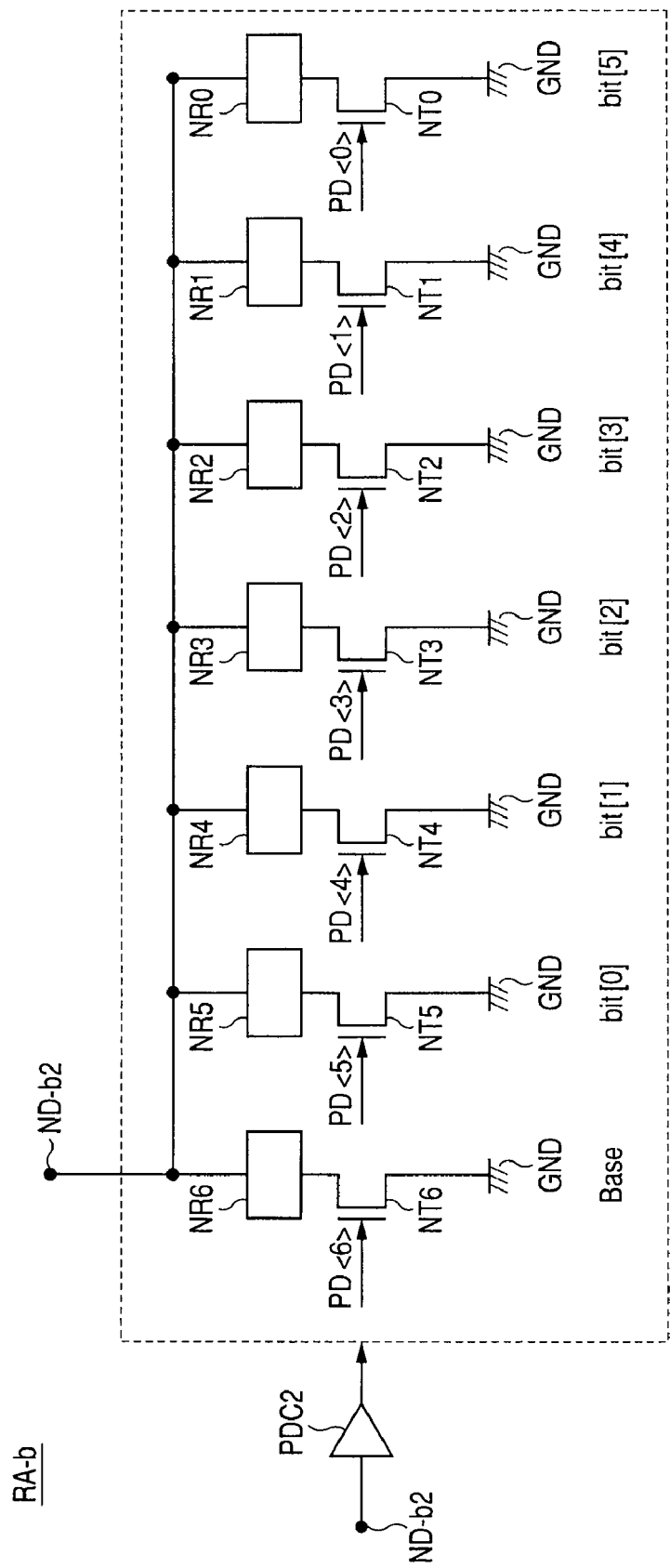
FIG. 5 is a diagram showing the configuration of a second-type resistance adjuster RA-b.

FIG. 5 shows the configuration of the second-type resistance adjuster RA-b. The resistance adjuster RA1-2b shown in FIG. 2 has the configuration of the second-type resistance adjuster RA-b. As an example, the first resistance adjuster RA-b has a 7-bit configuration. Hereinafter, resistance adjusters RAx-yb and RAx-ybz (where x, y, and z are natural numbers) correspond to the second-type resistance adjuster RA-b.

The second-type resistance adjuster RA-b has 7 sets (7 bits) made of N-channel MOS transistors NT0 to NT6 (also written as NTn) and resistive elements NR0 to NR6 (also written as NRn) coupled between reference voltage GND and a node ND-b2. The second-type resistance adjuster RA-b also has a pre-driver circuit PDC2 which receives a pull-down code PD and on-off drives the N-channel MOS transistors NTn.

The resistance value of the second-type resistance adjuster RA-b is adjusted by turning on/off the N-channel MOS transistors NT0 to NT5 by the pull-down code of six bits bit[5] to bit [0]. The bit of the base (the N-channel MOS transistor NT6) is always on. That is, when the pull-down code PD1 is 0, the resistance value of only the base bit is obtained. The gate length of the N-channel MOS transistor NTn used is selected in consideration of process fluctuations and ESD. As the resistive element NRn, an element having process fluctuations and temperature dependency as small as possible is used.

Figure 6:
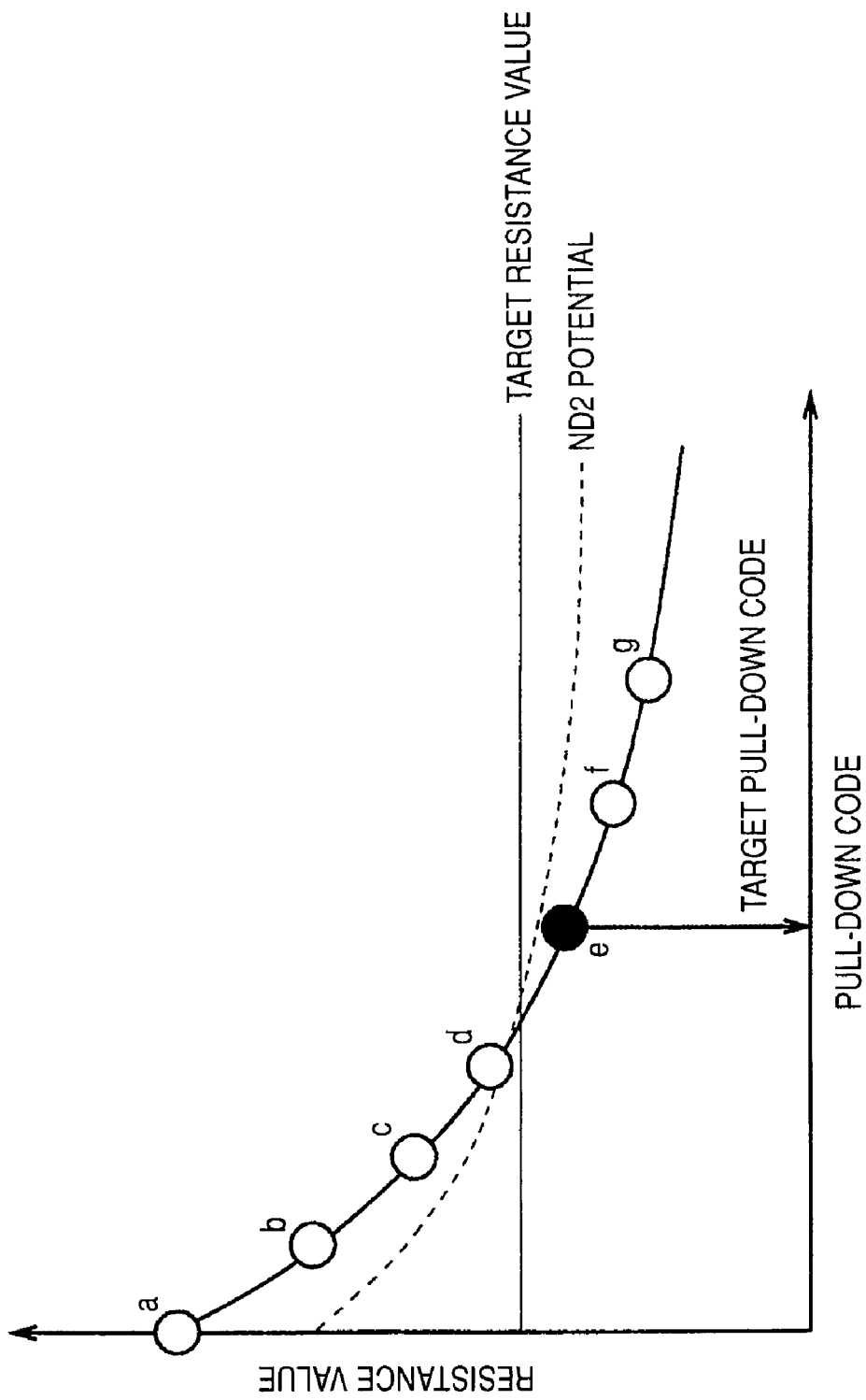
FIG. 6 is a diagram showing the relation between the pull-down code and the combined resistance value of the second resistance adjuster

FIG. 6 is a graph showing the relation between the pull-down code PD1 and the combined resistance value of the set of the N-channel MOS transistor NTn and the resistive element NRn configuring the second-type resistance adjuster RA-b. The horizontal axis indicates the pull-down code PD1 and the vertical axis indicates the resistance value.

The impedance adjuster IAC1 shown in FIG. 2 compares the resistance value generated on the receipt of the pull-up code PU1 (the resistance values of the first and second resistance adjusters RA1 and RA2) and the resistance value in the case of changing the pull-down code PD1 with the third resistance adjuster RA3 (the resistance adjuster RA1-2b) from small to large values (in FIG. 5, a→b→c→d→e→f→g). The impedance adjuster IAC1 outputs a detection signal at the time point ("e") when the resistance value of the resistance adjuster RA3 becomes smaller than the resistance value generated on receipt of the pull-up code PU1. The code at this time becomes a target pull-down code.

The size is adjusted so that the combination of the N-channel MOS transistor NTn and the resistive element NRn has continuity (monotonicity) as shown in FIG. 6.

Figure 7:
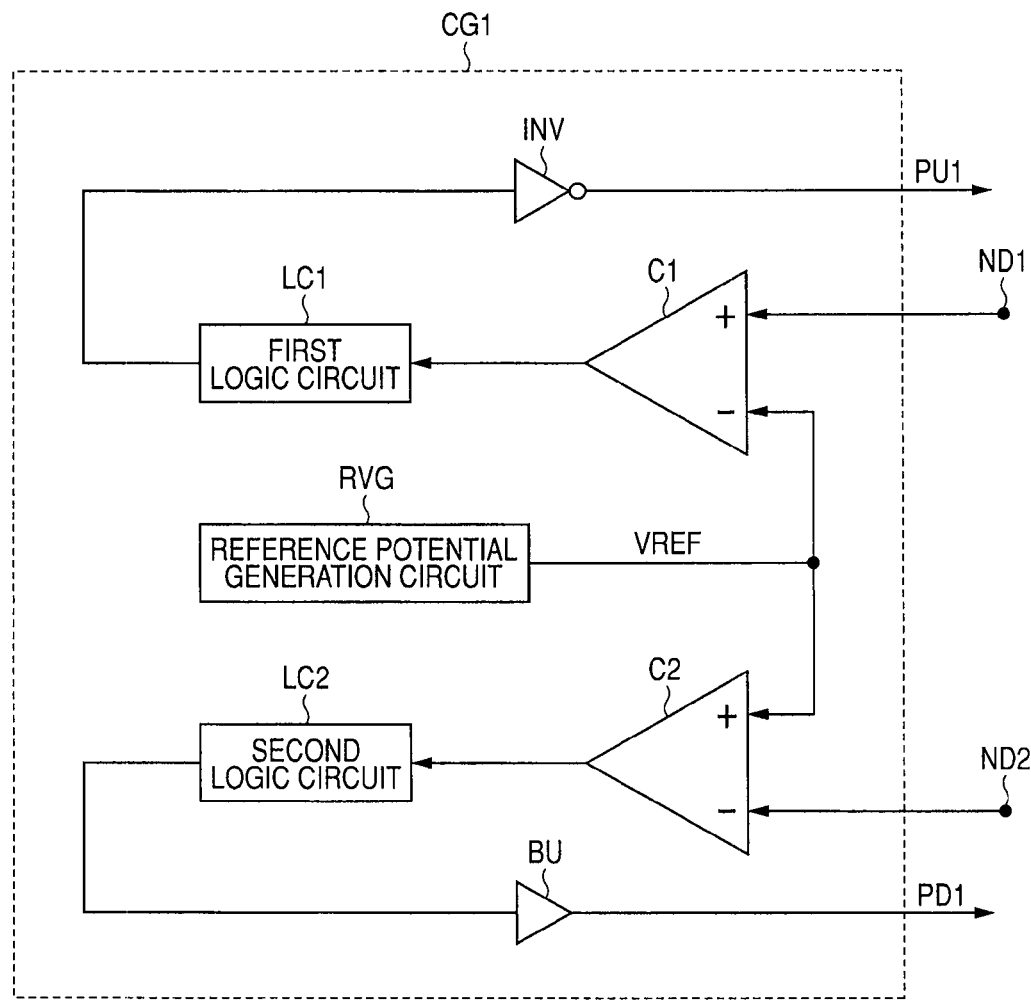
FIG. 7 is a diagram showing the configuration of a code generator CG.

FIG. 7 shows the configuration of the code generator CG1. The code generator CG1 has a first comparison circuit C1 for comparing the potential of the first node ND1 with a reference voltage VREF generated by a reference potential generation circuit RVG, and a second comparison circuit C2 for comparing the potential of the second node ND2 with the reference voltage VREF generated by the reference potential generation circuit RVG. The code generator CG1 also has a first logic circuit LC1 for adjusting the pull-up code PU1 in accordance with the comparison result of the first comparison circuit C1 and a second logic circuit LC2 for adjusting the pull-down code PD1 in accordance with the comparison result of the second comparison circuit C2. As the first logic circuit LC1, for example, a circuit having a calculation function of adding/subtracting "1" to/from the pull-up code PU1 in accordance with the comparison result is used. An inverter INV is inserted in the path of the pull-up code PU1, and a buffer BU is inserted in the path of the pull-down code PD1. They are inserted to set a signal output from the logic circuits to a signal level adapted to the type (P-channel type/N-channel type) of each of the transistors configuring the resistance adjuster. Inverters and buffer circuits which will be described later are provided for similar purposes.

By the pull-up code PU1 generated by the first comparison circuit C1 and the first logic circuit LC1, the resistance values of the first and second resistance adjusters RA1 and RA2 are adjusted to the resistance value of the external resistor ER. By the pull-down code PD1 generated by the second comparison circuit C2 and the second logic circuit LC2, the resistance value of the third resistance adjuster RA3 is adjusted to the resistance value adjusted by the pull-up code PU1. By using the pull-up code PU1 and the pull-down code PD1, the resistance value of the output buffer can be adjusted to the resistance value of the external resistor.

In the first embodiment, the potential according to the resistance ratio between the external resistor (reference resistor) ER and the resistance adjusters is detected by the code generator CG1. By the code generator CG1, a code signal for resistance adjustment is adjusted according to the detection result to adjust the resistance value of the resistance adjuster to that of the external resistor ER. By the code signal by which the resistance value of each of the resistance adjusters is adjusted to the resistance value of the external resistor ER, the resistance value of the output buffer is adjusted. Consequently, by adjusting the resistance value of the output buffer, adjustment to the resistance value of the external resistor is enabled.

Second Embodiment

Figure 8:
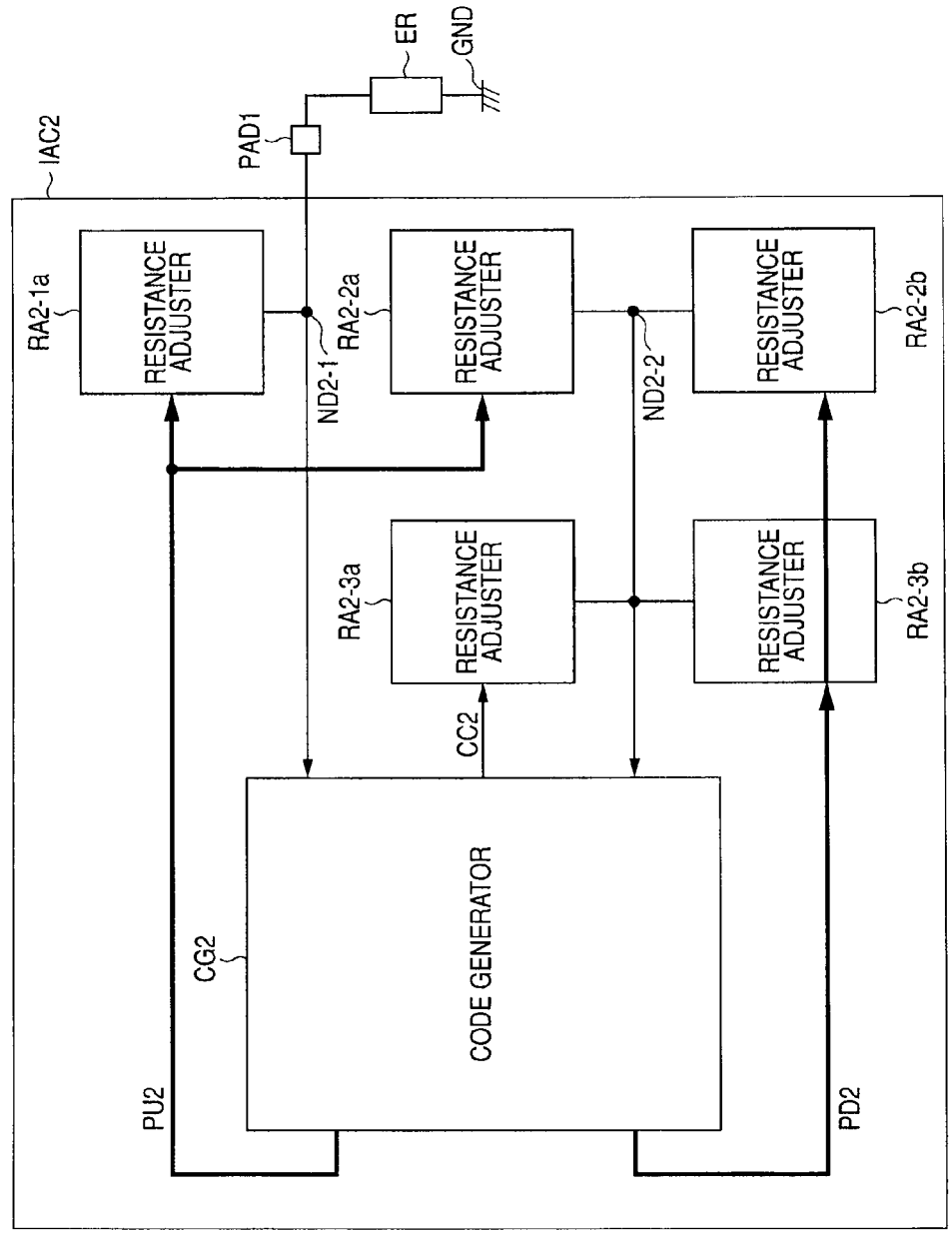
FIG. 8 is a schematic diagram of a semiconductor device SD2 as a second embodiment.

FIG. 8 is a schematic diagram of a semiconductor device SD2 as a second embodiment. The semiconductor device SD2 includes an impedance adjuster IAC2 and the external resistor ER. The semiconductor device SD2 also has resistance adjusters RA2-1a, RA2-2a, RA2-2b, RA2-3a, and RA2-3b, and a code generator CG2.

In the impedance adjuster IAC1 of the first embodiment, an error from the resistance value of the external resistor ER occurs according to the tone precision of the resistance value of the pull-up code PU1 of the resistance adjusters RA1-1*a* and RA1-2*a*. To the resistance value of the resistance adjuster RA1-2*a* having the error, the resistance value of the resistance adjuster RA1-2*b* is adjusted. An error from the resistance value of the resistance adjuster RA1-2*a* occurs according to the tone precision of the resistance value of the pull-down code PD1 also in the resistance adjuster RA1-2*b*. Therefore, finally, the error between the resistance value of the resistance adjuster RA1-2*b* and the resistance value of the external resistor ER becomes large. As a result, the error between the external resistor ER and the resistance value after resistance adjustment becomes large. Consequently, in the impedance adjuster IAC2 of the second embodiment, the adjustment error of the resistance value in the first embodiment is reduced.

In the embodiment, the code generator CG2 compares potential of a node ND2-1 determined by a resistance ratio between the external resistor ER and the resistance adjuster RA2-1*a* with a reference potential, generates a code signal (pull-up code PU2) according to a comparison result, and adjusts the resistance values of the resistance adjusters in accordance with the code signal. The code generator CG2 adjusts the resistance value of the resistance adjuster RA2-2*a* by using the code signal used for adjustment of the resistance value of the resistance adjustor RA2-1*a*. On the other hand, to the resistance adjuster RA2-3*a*, a correction code CC2 obtained by subtracting "1" from the pull-up code PU2 is given.

Figure 9:
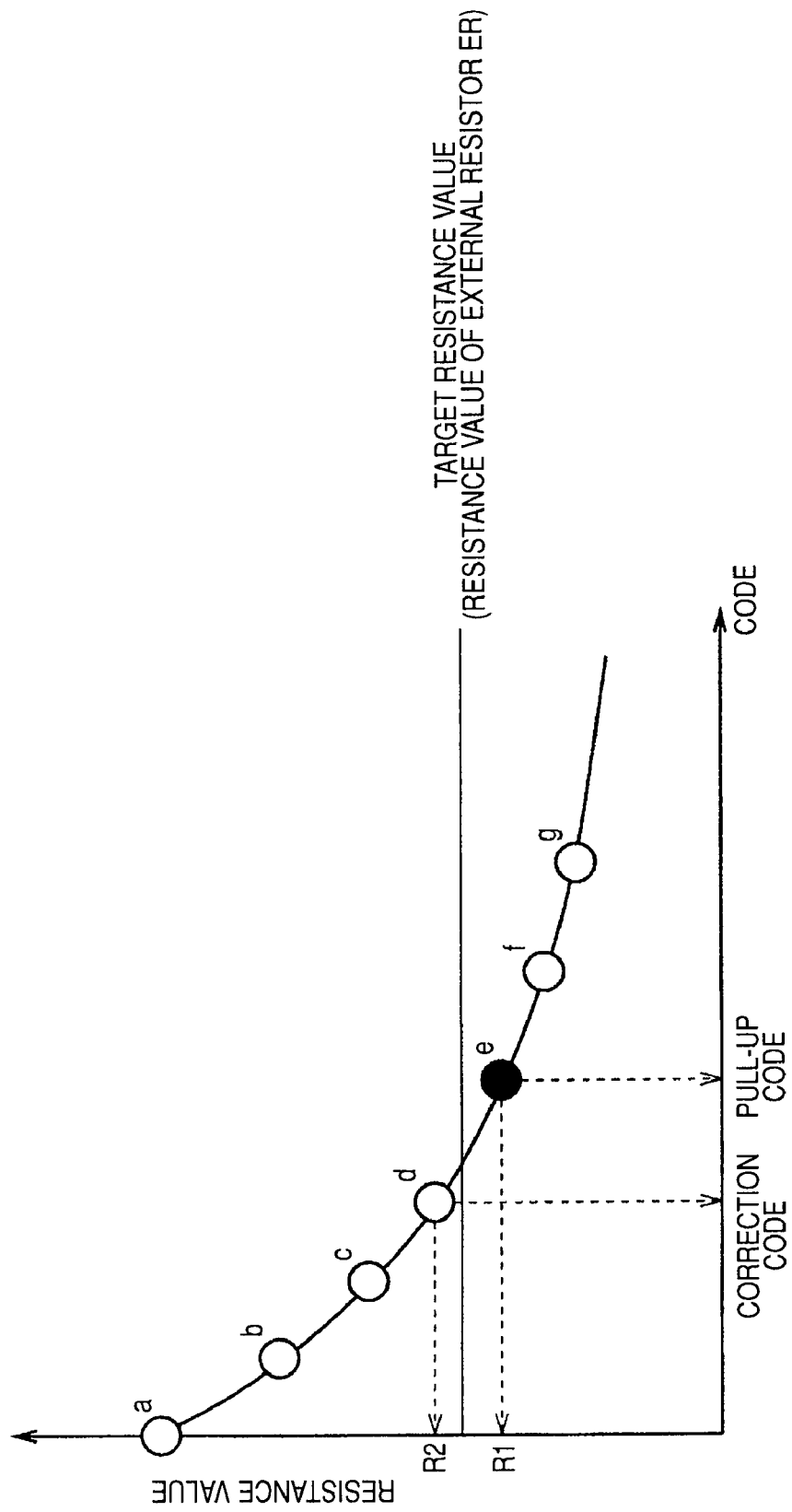
FIG. 9 is a diagram showing the relation between a pull-up code PU2 and a correction code CC2.

FIG. 9 shows the relation between the pull-up code PU2 and the correction code CC2. Since a code when the resistance value of the resistance adjuster RA2-1*a* becomes smaller than the resistance value of the external resistor is a target pull-up code, the resistance value of the resistance adjuster RA2-2*a* becomes smaller than the resistance value of the external resistor. On the other hand, the resistance value of the resistance adjuster RA2-3*a* to which a correction code CC obtained by subtracting "1" from the pull-up code becomes larger than the resistance value of the external resistor. Therefore, by setting the resistance value of the resistance adjuster RA2-2*a* and that of the resistance adjuster RA2-3*a* to a combined resistance value of parallel connection, the error from the resistance value of the external resistor ER can be reduced.

Further, the resistance values of the resistance adjusters RA2-2*b* and RA2-3*b* are adjusted on the basis of the code signal (pull-down code PD2). The pull-down code PD2 is generated according to a comparison result between the potential of the node ND2-2 determined by the ratio between the combined resistance value of the resistance adjusters RA2-2*a* and RA2-3*a* and the combined resistance value of the resistance adjusters RA2-2*b* and RA2-3*b* with the reference potential.

Figure 10:
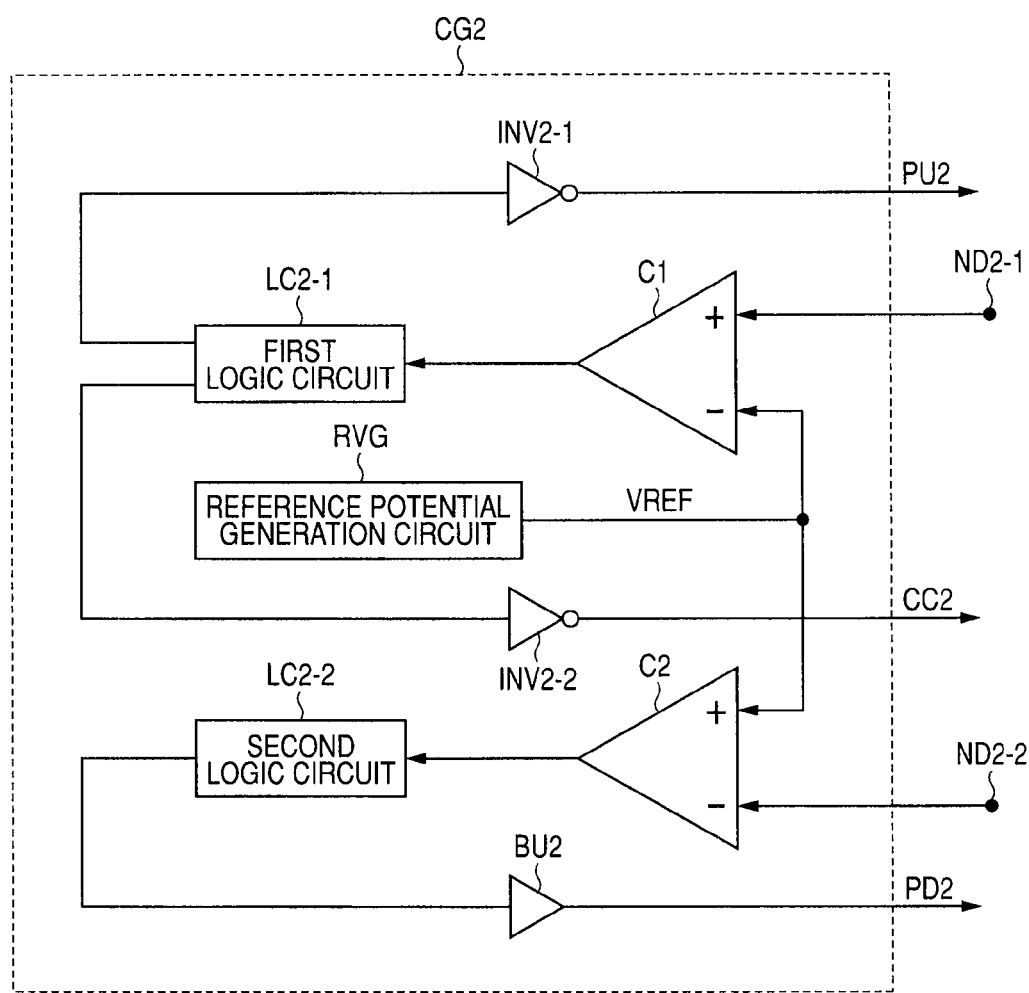
FIG. 10 is a diagram showing the configuration of a code generator CG2.

FIG. 10 shows the configuration of the code generator CG2. The code generator CG2 has: the first comparison circuit C1 for comparing the potential of the first node ND2-1 with the reference voltage VREF generated by the reference potential generation circuit RVG; and the second comparison circuit C2 for comparing the potential of the second node ND2-2 with the reference voltage VREF generated by the reference potential generation circuit RVG. The code generator CG2 also has: the first logic circuit LC2-1 for adjusting the pull-up code PU2 in accordance with the comparison result of the first comparison circuit C1; and the second logic circuit LC2-2 for adjusting the pull-down code PD2 in accordance with the comparison result of the second comparison circuit C2.

Inverters INV2-1 and INV2-2 are inserted in the path of the pull-up code PU2 and the correction code CC2, and a buffer BU2 is inserted in the path of the pull-down code PD2.

The first logic circuit LC2-1 also generates the correction code CC2 obtained by subtracting "1" from the pull-up code PU2. As the first logic circuit LC2-1, for example, a circuit having a calculation function of adding/subtracting "1" to/from the pull-up code in accordance with the comparison result is used. For generating the correction code, a circuit having a calculation function of subtracting "1" from the pull-up code is used.

The resistance adjusters RA2-1*a*, RA2-2*a*, and RA2-3*a* have the configuration of the first-type resistance adjuster RA-a. The resistance adjusters RA2-3*b* and RA2-2*b* have the configuration of the second-type resistance adjuster RA-b. A method of adjusting a resistance value by using a pull-up code and a pull-down code is similar to that of the first embodiment, so that its detailed description will not be repeated.

In the second embodiment, the potential according to the resistance ratio between the external resistor ER and the resistance adjusters is detected by the code generator CG2. By the code generator CG2, a code signal for resistance adjustment is adjusted according to the detection result to adjust the resistance value of the resistance adjuster to that of the external resistor ER. As code signals, the code generator CG2 generates the pull-up code PU2, the pull-down code PD2, and the correction code CC2. By using the combined resistance value of the resistance value lower than the resistance value of the external resistor ER adjusted by the pull-up code PU2 and the resistance value higher than the resistance value of the external resistor ER adjusted by the correction code 2, the resistance values of the resistance adjusters are adjusted to the resistance value of the external resistor ER.

Further, by the code signal by which the resistance value of each of the resistance adjusters is adjusted to the resistance value of the external resistor ER, the resistance value of the output buffer is adjusted. Consequently, by adjusting the resistance value of the output buffer, adjustment to the resistance value of the external resistor is enabled. In addition, in the second embodiment, since the combined resistance value of the resistance value lower than that of the external resistor adjusted by the pull-up code and the resistance value higher than that of the external resistor adjusted by the correction code is used, the resistance adjustment having a smaller error with respect to the resistance value of the external resistor can be performed.

Third Embodiment

In the impedance adjuster IAC1 of the first embodiment, only one kind of the resistance value can be adjusted on the basis of one external resistance. However, for example, in DDR3, a plurality of output driver impedances and termination resistors are specified. At least three kinds of resistance values have to be combined, and at least two kinds of resistance values have to be adjusted. As a method of realizing a circuit for adjusting two kinds of resistance values, there is a method of coupling two external resistors and adjusting the resistance values by the impedance adjusters IAC1 of the first embodiment. However, it is not so practical when the cost of the external resistors and the area penalty of the impedance adjusters to the chip are considered.

Figure 11:
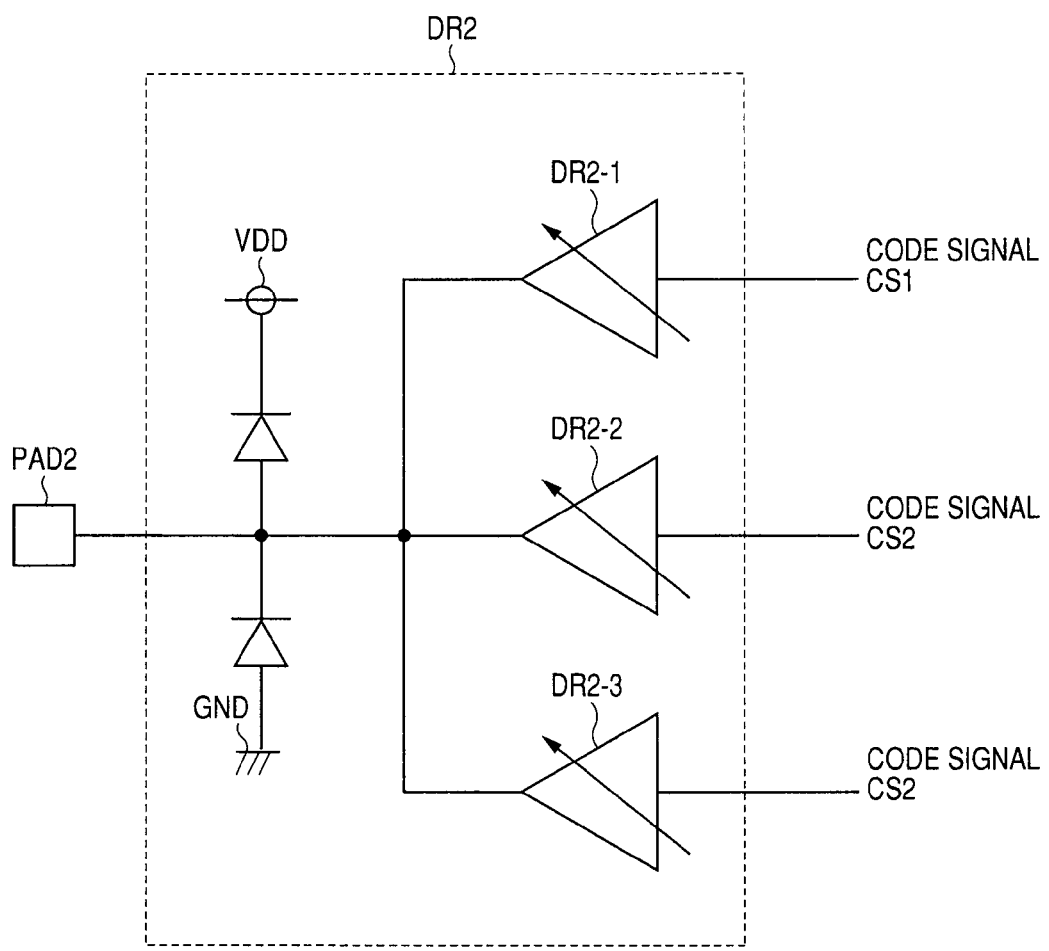
FIG. 11 is a diagram showing an example of an output driver.

FIG. 11 shows an example of the output driver. In an output driver DR2, a driver DR2-1 which can adjust a resistance value to 240Ω in accordance with the code signal CS1, a driver DR2-2 which can adjust a resistance value to 120Ω in accordance with the code signal CS2, and a driver DR2-3 which can adjust a resistance value to 60Ω in accordance with the code signal CS2. As the driver DR2-3, to reduce the number of code signals to be generated, drivers each capable of adjusting a resistance value to 120Ω are coupled in parallel.

FIG. 12 shows resistance values of the output driver DR2 which can be realized by combination of on/off (○/x) states of the drivers DR2-1, DR2-2, and DR2-3. For example, when all of the drivers DR2-1 to DR2-3 are on and the resistance is adjusted by code signals, the output driver DR2 can adjust the resistance value to 34.2Ω. By the combination of on/off (o/x) states of the transistors, with the configuration of FIG. 11, seven resistance values can be realized.

Specifically, by generating code signals for adjusting two kinds of resistance values on the basis of the resistance value of the external resistor, a plurality of resistance values can be adjusted. The third embodiment is to provide an impedance adjuster for adjusting two resistance values on the basis of a single external resistor.

Figure 13:
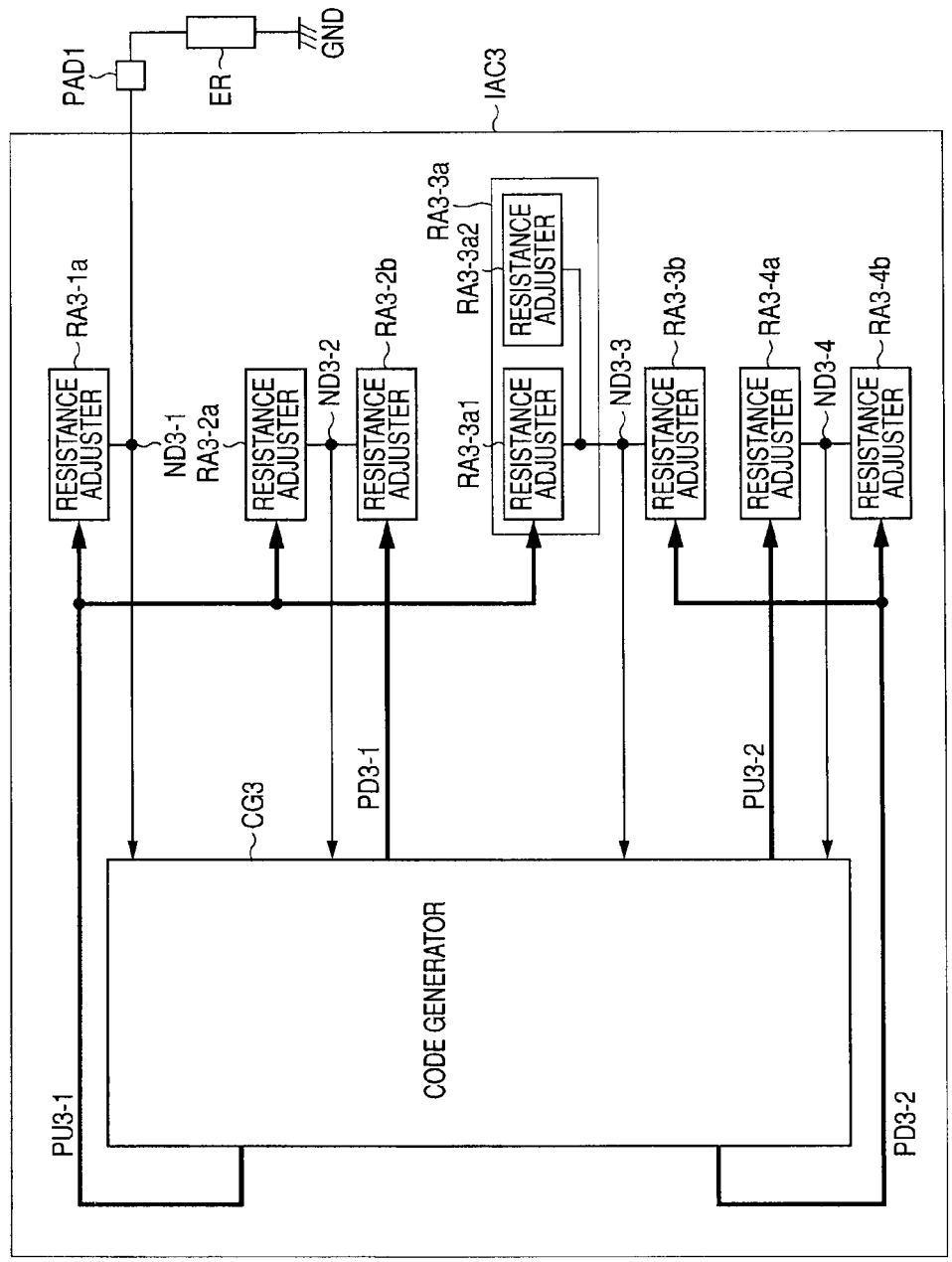
FIG. 13 is a schematic diagram of a semiconductor device SD3 as a third embodiment.

FIG. 13 is a schematic diagram of a semiconductor device SD3 as the third embodiment. The semiconductor device SD3 includes an impedance adjuster IAC3 and the external resistor ER. The impedance adjuster IAC3 includes resistance adjusters RA3-1a, RA3-2a, RA3-2b, RA3-3a (RA3-3a1 and RA3-3a2), RA3-3b, RA3-4a, RA3-4b, and a code generator CG3.

In the embodiment, the code generator CG3 compares potential of a node ND3-1 determined by a resistance ratio between the external resistor ER and the resistance adjuster RA3-1a with a reference potential, generates a code signal (pull-up code PU3-1) according to a comparison result, and adjusts the resistance values of the resistance adjusters in accordance with the code signal. The code generator CG3 adjusts the resistance value of the resistance adjuster RA3-2a by using the code signal (pull-up code PU3-1) used for adjustment of the resistance value of the resistance adjustor RA3-1a.

Further, the resistance value of the resistance adjuster RA3-2b is adjusted on the basis of the code signal (pull-down code PD3-1). The pull-down code PD3-1 is generated according to a comparison result of the potential of the node ND3-2 determined by the resistance ratio between the resistance adjusters RA3-2a and RA3-2b with the reference potential.

The resistance value of the resistance adjuster RA3-3a is adjusted by using the code signal (pull-up code PU3-1) used for adjusting the resistance value of the resistance adjuster RA3-1a. The resistance adjusters RA3-1a and RA3-2a has the configuration of the first-type resistance adjuster RA-a. The resistance adjuster RA3-3a has a configuration that the resistance adjusters RA3-3a1 and RA3-3a2 as the first-type resistance adjuster RA-a are coupled in parallel. That is, the resistance value of the resistance adjuster RA3-3a is the half of that of the resistance adjuster RA3-1a or RA3-2a.

The potential of the node ND3-3 determined by the resistance ratio between the resistance adjusters RA3-3a and RA3-3b is compared with the reference potential, a code signal (pull-down code PD3-2) according to the comparison result is generated, and the resistance value of the resistance adjuster RA3-3b is adjusted according to the code signal. The resistance value of the resistance adjuster RA3-4b is adjusted by using the code signal (pull-down code PD3-2) used for adjustment of the resistance value of the resistance adjuster RA3-3b. Further, the resistance value of the resistance adjuster RA3-4a is adjusted on the basis of the code signal (pull-up code PU3-2). The pull-up code PU3-2 is generated according to a result of comparison between the potential of the node ND3-4 determined by the resistance ratio between the resistance adjusters RA3-4a and RA3-4b in the code generator CG3 with the reference potential.

In such a manner, the code signals (the pull-up code PU3-1 and the pull-down code PD3-1) for adjustment to the same resistance value as that of the external resistor ER and the code signals (the pull-up code PU3-2 and the pull-down code PD3-2) for adjustment to the resistance value of the half of the resistance value of the external resistor ER can be generated.

Figure 14:
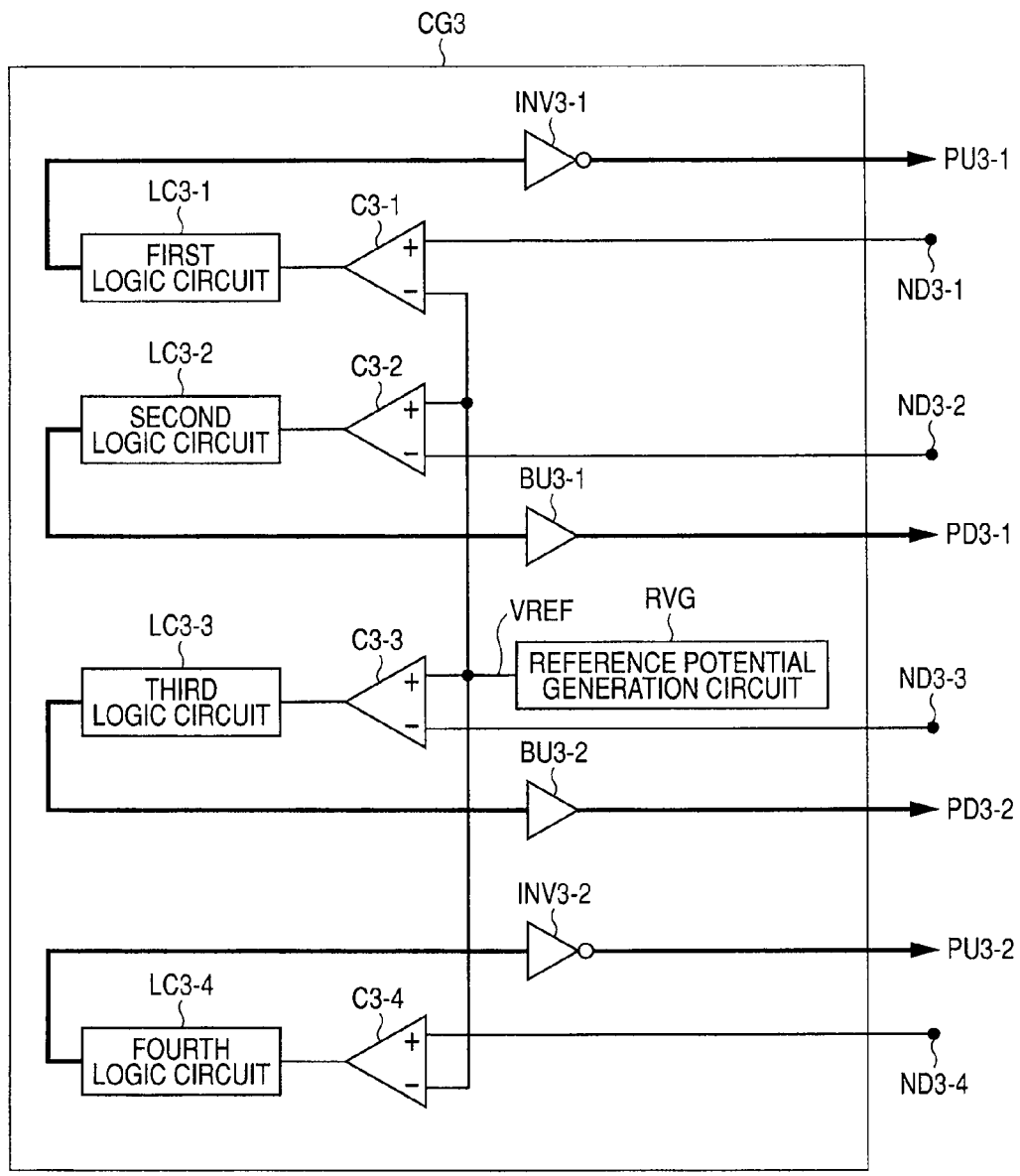
FIG. 14 is a diagram showing the configuration of a code generator CG3.

FIG. 14 shows the configuration of the code generator CG3. The code generator CG3 has first to fourth comparison circuits C3-1 to C3-4 for comparing the potential of the first to fourth nodes ND3-1 to ND3-4 with the reference potential VREF generated by the reference potential generation circuit RVG. The code generator CG3 also has first to fourth logic circuits LC3-1 to LC3-4 for adjusting pull-up codes or pull-down codes in accordance with a result of comparison of the first to fourth comparison circuits C3-1 to C3-4. The resistance value (code signal) of each of the resistance adjusters is adjusted by using the code generator CG3.

The resistance adjusters RA3-1a, RA3-2a, RA3-3a1, RA3-3a2, and RA3-4a have the configuration of the first-type resistance adjuster RA-a. The resistance adjusters RA3-2b, RA3-3b, and RA3-4b have the configuration of the second-type resistance adjuster RA-b. A method of adjusting a resistance value by using a pull-up code and a pull-down code is similar to that of the first embodiment, so that its detailed description will not be repeated. Inverters INV3-1 and INV3-2 are inserted in the path of the pull-up codes PU3-1 and PU3-2, and buffers BU3-1 and BU3-2 are inserted in the path of the pull-down codes PD3-1 and PD3-2.

In the third embodiment, the potential according to the resistance ratio between the external resistor ER and the resistance adjusters is detected by the code generator CG3. By the code generator CG3, a first-type code signal for resistance adjustment is adjusted according to the detection result to adjust the resistance value of the resistance adjuster to that of the external resistor ER. Further, the code generator CG2 generates a second-type code signal for adjusting the resistance values of a plurality of resistance adjusters coupled in parallel in accordance with the first-type code signal and, on the basis of the resistance values of the resistance adjuster coupled in parallel, adjusting the resistance value to a resistance value different from of that of the external resistor ER.

As described above, in the resistance adjustment of the embodiment, two kinds of code signals (pull-up code and pull-down code) can be generated on the basis of one external resistance, and two resistance values (for example, the resistance value of the external resistor ER and the resistance value of the half of the resistance value of the external resistor ER) can be adjusted. By changing the number of the first-type resistance adjusters RA-a which are coupled in parallel in the resistance adjuster RA3-3a, the resistance value to be adjusted can be changed.

Fourth Embodiment

Figure 15:
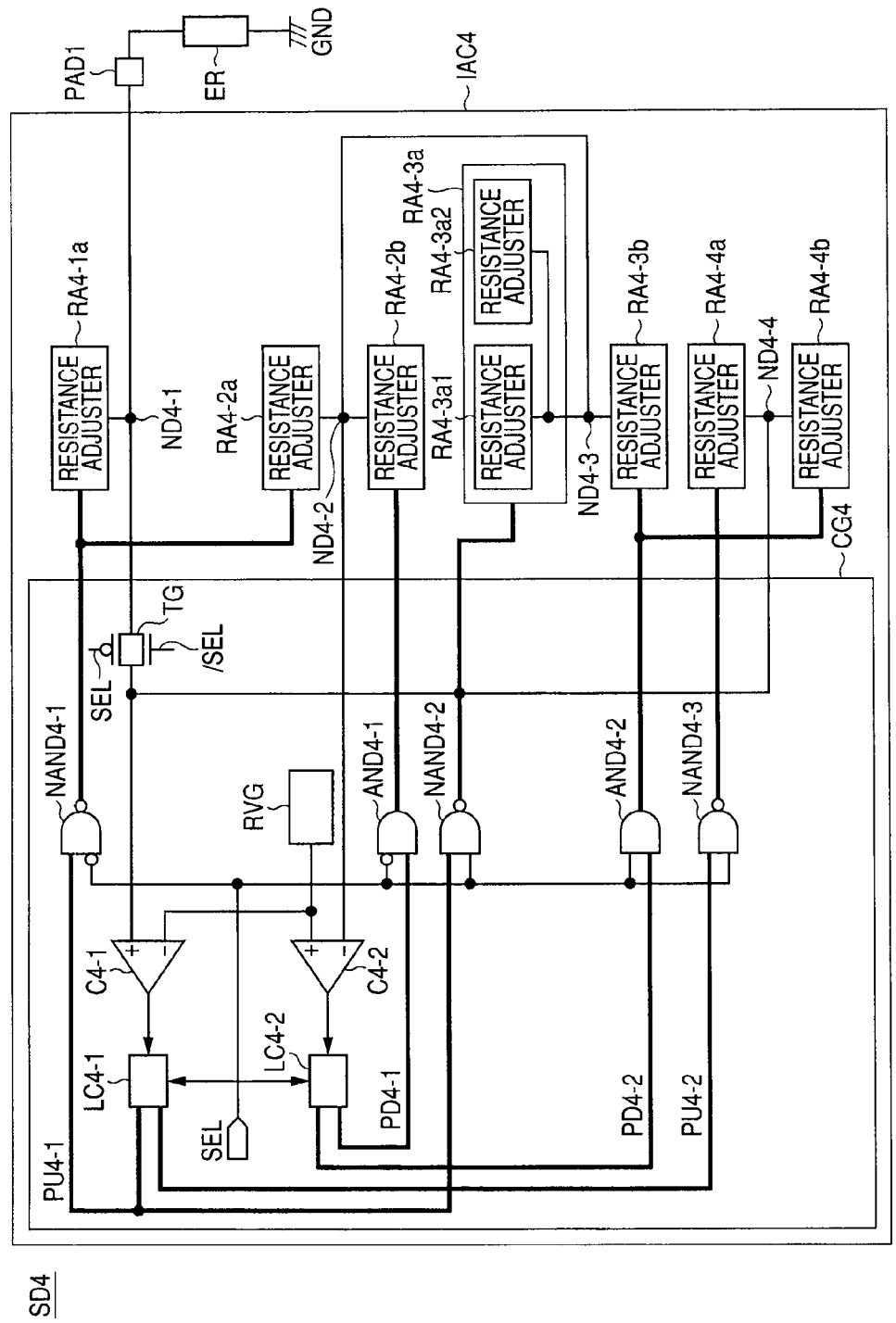
FIG. 15 is a schematic diagram of a semiconductor device SD4 as a fourth embodiment.

FIG. 15 is a schematic diagram of a semiconductor device SD4 as a fourth embodiment. The semiconductor device SD4 includes an impedance adjuster IAC4 and the external resistor ER. The impedance adjuster IAC4 includes resistance adjusters RA4-1a, RA4-2a, RA4-2b, RA4-3a (RA4-3a1 and RA4-3a2), RA4-3b, RA4-4a, RA4-4b, and a code generator CG4.

The impedance adjuster IAC4 is a modification of the impedance adjuster IAC3 in the third embodiment, and the code generator CG3 is changed to the code generator CG4. Consequently, only the code generator CG4 will be described here, and the detailed description of the other unchanged configuration will not be repeated.

In the code generator CG4, by decreasing the number of comparison circuits in the code generator 3, the circuit area is reduced. Specifically, NAND circuits NAND4-1 to 4-3, AND circuits AND4-1 and AND4-2, and a transfer gate TG are added. In the pull-down code system, a comparison circuit C4-2 and a logic circuit LC4-2 are shared. In the pull-up code system, a comparison circuit C4-1 and a logic circuit LC4-1 are shared. By complementary select signals SEL and /SEL, coupling is changed to adjust each of the two kind of resistance values.

In the case of adjusting the resistance values of the resistance adjusters RA4-1a, RA4-2a, and RA4-2b (first adjustment stage), the select signal SEL is set as the L-level signal. At this time, the NAND circuit NAND4-1 and the AND circuit AND4-1 transmit corresponding code signals to the resistance adjusters RA4-1a, RA4-2a, and RA4-2b to adjust the resistance adjusters RA4-1a, RA4-2a, and RA4-2b (adjust the code signals). On the other hand, the NAND circuit NAND4-2 transmits an H-level signal to the resistance adjuster RA4-3a. The NAND circuit NAND4-3 transmits an H-level signal to the resistance adjuster RA4-4a. The AND circuit AND4-2 transmits an L-level signal to the resistance adjusters RA4-3b and RA4-4b. The resistance adjusters RA4-3a, RA4-3b, RA4-4a, and RA4-4b do not adjust the resistance.

In the case of adjusting the resistance values of the resistance adjusters RA4-3a, RA4-3b, RA4-4a, and RA4-4b (second adjustment stage), the select signal SEL is set as the H-level signal. At this time, the NAND circuits NAND4-2 and NAND4-3 and the AND circuit AND4-2 transmit corresponding code signals to the resistance adjusters RA4-3a, RA4-3b, RA4-4a, and RA4-4b to adjust the resistance of the resistance adjusters RA4-3a, RA4-3b, RA4-4a, and RA4-4b. On the other hand, the NAND circuit NAND4-1 transmits an H-level signal to the resistance adjusters RA4-1a and RA4-2a. The AND circuit AND4-1 transmits an L-level signal to the resistance adjuster RA4-2b. The resistance adjusters RA4-1a, RA4-2a, and RA4-2b do not adjust the resistance.

By using the select signal, the comparison circuits and the logic circuits can be shared, and the area can be reduced as a whole.

In the fourth embodiment, in a manner similar to the third embodiment, two kinds of pull-up codes and pull-down codes (codes for resistance adjustment) can be generated on the basis of one external resistance, and two resistance values (the resistance value of the external resistor ER and the resistance value of the half of the resistance value of the external resistor ER) can be adjusted. By using the select signal, adjustment of two kinds of resistance values can be controlled separately, the comparison circuits can be shared, and the area can be reduced.

Fifth Embodiment

Figure 16:
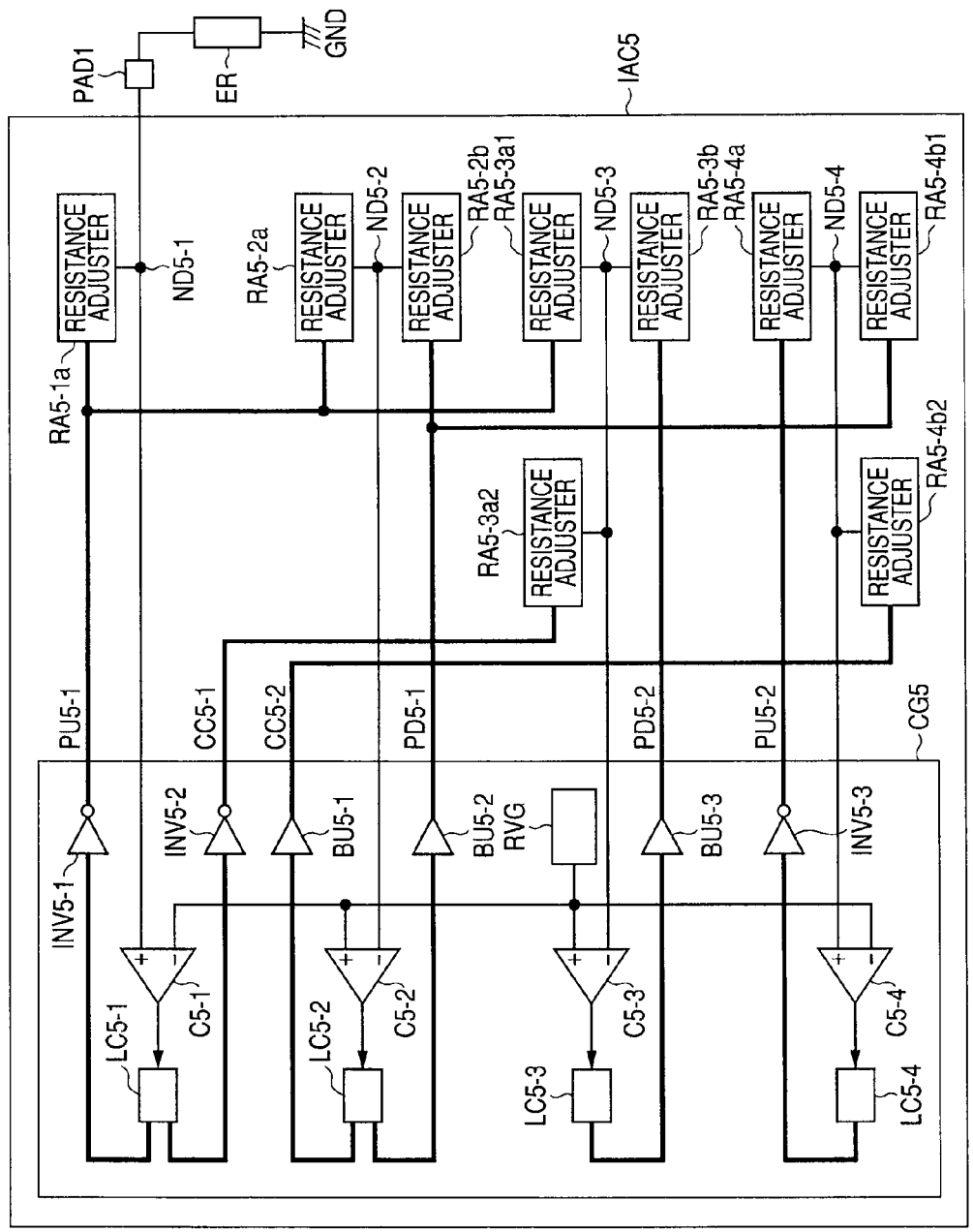
FIG. 16 is a schematic diagram of a semiconductor device as a fifth embodiment.

FIG. 16 is a schematic diagram of a semiconductor device SD5 as a fifth embodiment. The semiconductor device SD5 is configured by an impedance adjustor IAC5 and the external resistor ER. The impedance adjuster IAC5 is configured by resistance adjusters RA5-1a, RA5-2a, RA5-2b, RA5-3a1, RA5-3a2, RA5-3b, RA5-4a, RA5-4b, RA5-4b2, and a code generator CG5.

In the embodiment, an impedance adjuster achieving reduction in an adjustment error in a resistance value in the first embodiment and adjusting two resistance values on the basis of one external resistor is provided. That is, the impedance adjuster is a circuit having advantages of the circuits of the second and third embodiments.

In the impedance adjuster IAC5, the code generator CG5 compares the potential at a node ND5-1 determined by the resistance ratio between the external resistor ER and the resistance adjuster RA5-1a with reference potential, adjusts the pull-up code PU5-1 in accordance with the comparison result, and adjusts the resistance values of the resistance adjusters.

The resistance value of the resistance adjuster RA5-2a is adjusted by using the pull-up code PU5-1 used for adjustment of the resistance value of the resistance adjuster RA5-1a. Further, the resistance value of the resistance adjuster RA5-2b is adjusted by using the pull-down code PD5-1. The pull-down code PD5-1 is adjusted according to a result of comparison between the potential at the node ND5-2 determined by the resistance ratio between the resistance adjuster RA5-2a and the resistance adjuster RA5-2b with the reference potential in the code generator CG5.

The resistance value of the resistance adjuster RA5-3a1 is adjusted by using the pull-up code PU5-1 used for adjusting the resistance value of the resistance adjuster RA5-1a. The resistance value of the resistance adjuster RA5-3a2 is adjusted by using a correction code CC5-1 obtained by subtracting 1 from the pull-up code PU5-1.

The configuration of the resistance adjusters RA5-3a1 and RA5-3a2 is that of the first-type resistance adjuster RA-1 like the resistance adjusters RA5-1a and RA5-2a. That is, a resistance adjuster RA5-3a (not shown) as a combined resistance of the resistance adjusters RA5-3a1 and RA5-3a2 has a value which is about the half of the resistance value of the external resistor.

By setting the combined resistance value by parallel coupling of the resistance values of the resistance adjusters RA5-3a1 and RA5-3a2, an error from the external resistance value ER can be reduced.

On the basis of the resistance value, the resistance value of the resistance adjuster RA5-3b is adjusted by using the pull-down code PD5-2. The pull-down code PD5-2 is adjusted in accordance with a comparison result between the potential at the node ND5-3 determined by the resistance ratio between the resistance adjuster RA5-3a (combined resistance between RA5-3a1 and RA5-3a2) and the resistance adjuster RA5-3b with the reference potential in the code generator CG5.

The resistance value of the resistance adjuster RA5-4b1 is adjusted by using the pull-down code PD5-1 used for adjustment of the resistance value of the resistance adjuster RA5-2b. Further, the resistance value of the resistance adjuster RA5-4b2 is adjusted by using a correction code CC5-2 obtained by subtracting 1 from the pull-down code PD5-1.

The configuration of the resistance adjusters RA5-4b1 and RA5-4b2 is that of the second-type resistance adjuster RA-b like the resistance adjusters RA5-2b. That is, a resistance adjuster RA5-4b (not shown) as a combined resistance of the resistance adjusters RA5-4b1 and RA5-4b2 has a value which is about the half of the resistance value of the external resistor.

By setting the combined resistance value by parallel coupling of the resistance values of the resistance adjusters RA5-4b1 and RA5-4b2, an error from the external resistance value ER can be reduced.

On the basis of the resistance value, the resistance value of the resistance adjuster RA5-4a is adjusted by using the pull-up code PU5-2. The pull-up code PU5-2 is adjusted in accordance with a comparison result between the potential at the node ND5-4 determined by the resistance ratio between the resistance adjuster RA5-4b (combined resistance between RA5-4b1 and RA5-4b2) and the resistance adjuster RA5-4a with the reference potential in the code generator CG5.

The method of adjusting a resistance value using the pull-up code and pull-down code is similar to that of the foregoing embodiments and its detailed description will not be repeated here.

In the embodiment, the potential determined by the resistance ratio between the external resistor ER and the resistance adjusters is detected by the code generator CG5. The code generator CG5 adjusts a first-type code signal for resistance adjustment in accordance with the detection result, and adjusts the resistance value of each of the resistance adjusters to the external resistor ER. Further, the code generator CG5 adjusts the resistance values of the resistance adjusters coupled in parallel on the basis of the first-type code signal and a correction code and, on the basis of the resistance values of the resistance adjusters coupled in parallel, generates a second-type code signal for adjusting to a resistance value different from the external resistor ER. In the code generator CG5, inverters INV5-1, INV5-2, and INV5-3 are inserted in the path of the pull-up codes PU5-1 and PU5-2 and the correction code CC5-1. Buffers BU5-1, BU5-2, and BU5-3 are inserted in the path of the pull-down codes PD5-1 and PD5-2 and the correction code CC5-2.

Consequently, in the fifth embodiment, the first-type code signal (pull-up code PU5-1 and pull-down code PD5-1) for adjustment to the resistance value of the external resistor ER and the second-type code signal (pull-up code PU5-2 and pull-down code PD5-2) which is about the half of the external resistor ER can be generated. Further, since the second-type code signal (pull-up code PU5-2 and pull-down code PD5-2) is adjusted by using the correction code, higher-precision resistance value adjustment can be realized.

Sixth Embodiment

Figure 17:
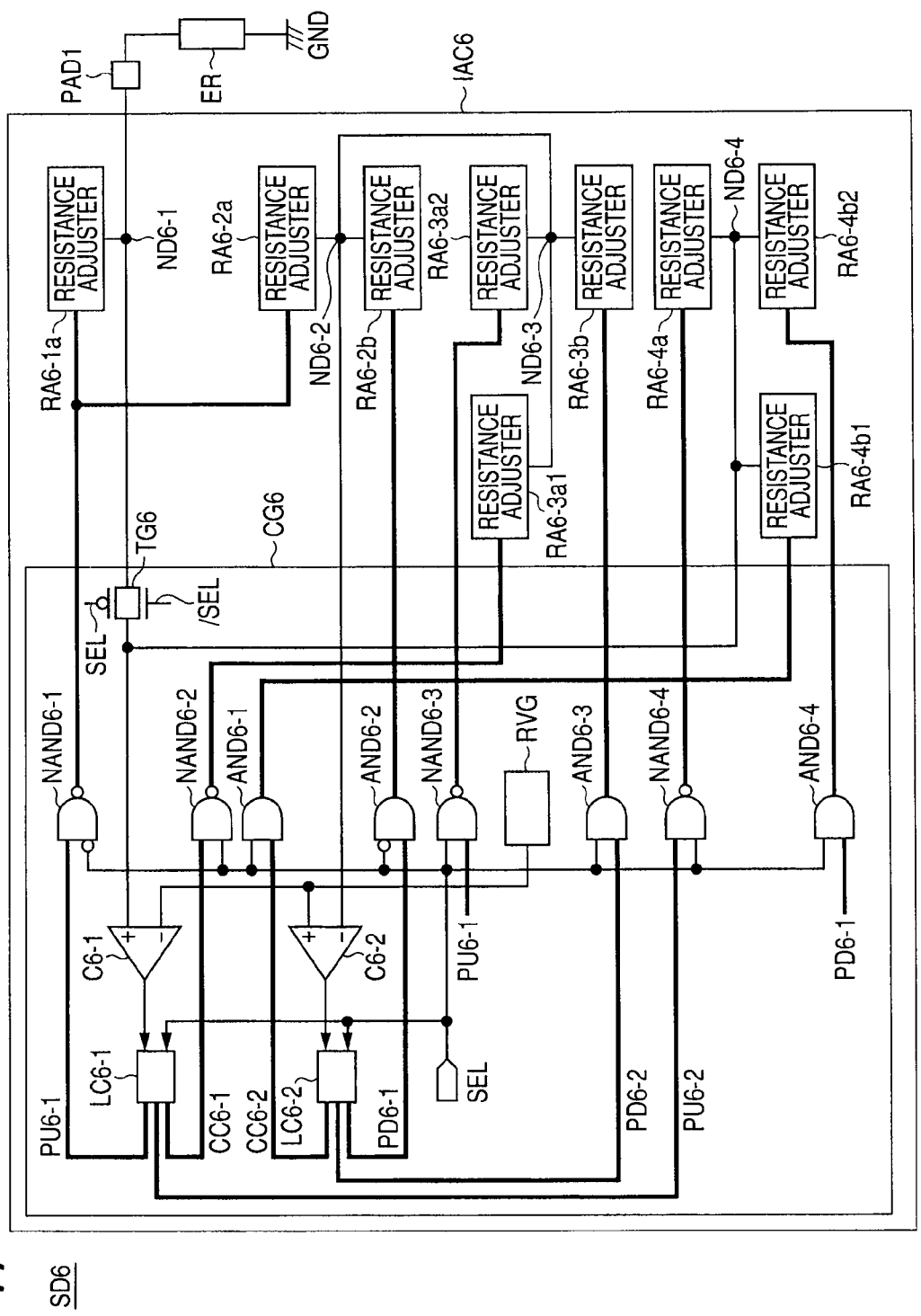
FIG. 17 is a schematic diagram of a semiconductor device as a sixth embodiment.

FIG. 17 is a schematic diagram of a semiconductor device SD6 as a sixth embodiment. The semiconductor device SD6 is configured by an impedance adjustor IAC6 and the external resistor ER. The impedance adjuster IAC6 is configured by resistance adjusters RA6-1a, RA6-2a, RA6-2b, RA6-3a1, RA6-3a2, RA6-3b, RA6-4a, RA6-4b1, RA6-4b2, and a code generator CG6.

The impedance adjuster IAC6 is a modification of the impedance adjuster IAC5 of the fifth embodiment. The configuration of the code generator CG5 and that of the code generator CG6 are different from each other. Consequently, only the code generator CG6 will be described, and the detailed description of the unchanged configuration will not be repeated.

In the code generator CG6, by decreasing the number of comparison circuits in the code generator CG5, the circuit area is reduced. Specifically, NAND circuits NAND6-1 to NAND6-4, AND circuits AND6-1 to AND6-4, and a transfer gate TG6 are added. In the pull-down code system, a comparison circuit C6-1 and a logic circuit LC6-1 are shared. In the pull-up code system, a comparison circuit C6-2 and a logic circuit LC6-2 are shared. By complementary select signals SEL/ and SEL, connection is changed and two kinds of resistance values are adjusted separately.

In the sixth embodiment, in a manner similar to the fifth embodiment, the potential determined by the resistance ratio between the external resistor ER and the resistance adjusters is detected by the code generator CG6. The code generator CG6 adjusts a first-type code signal for resistance adjustment in accordance with the detection result, and adjusts the resistance value of each of the resistance adjusters to the external resistor ER. Further, the code generator CG6 adjusts the resistance values of the resistance adjusters coupled in parallel on the basis of the first-type code signal and a correction code and, on the basis of the resistance values of the resistance adjusters coupled in parallel, generates a second-type code signal for adjusting to a resistance value different from the external resistor ER.

Consequently, in the sixth embodiment, the first-type code signal (pull-up code PU6-1 and pull-down code PD6-1) for adjustment to the resistance value of the external resistor ER and the second-type code signal (pull-up code PU6-2 and pull-down code PD6-2) which is about the half of the external resistor ER can be generated. Further, since the second-type code signal (pull-up code PU6-2 and pull-down code PD6-2) is adjusted by using the correction code, higher-precision resistance value adjustment can be realized. Further, by using the complementary select signals, two-kinds of resistance values are controlled separately. Consequently, the comparison circuit can be shared, and the area can be reduced.

Seventh Embodiment

Figure 18:
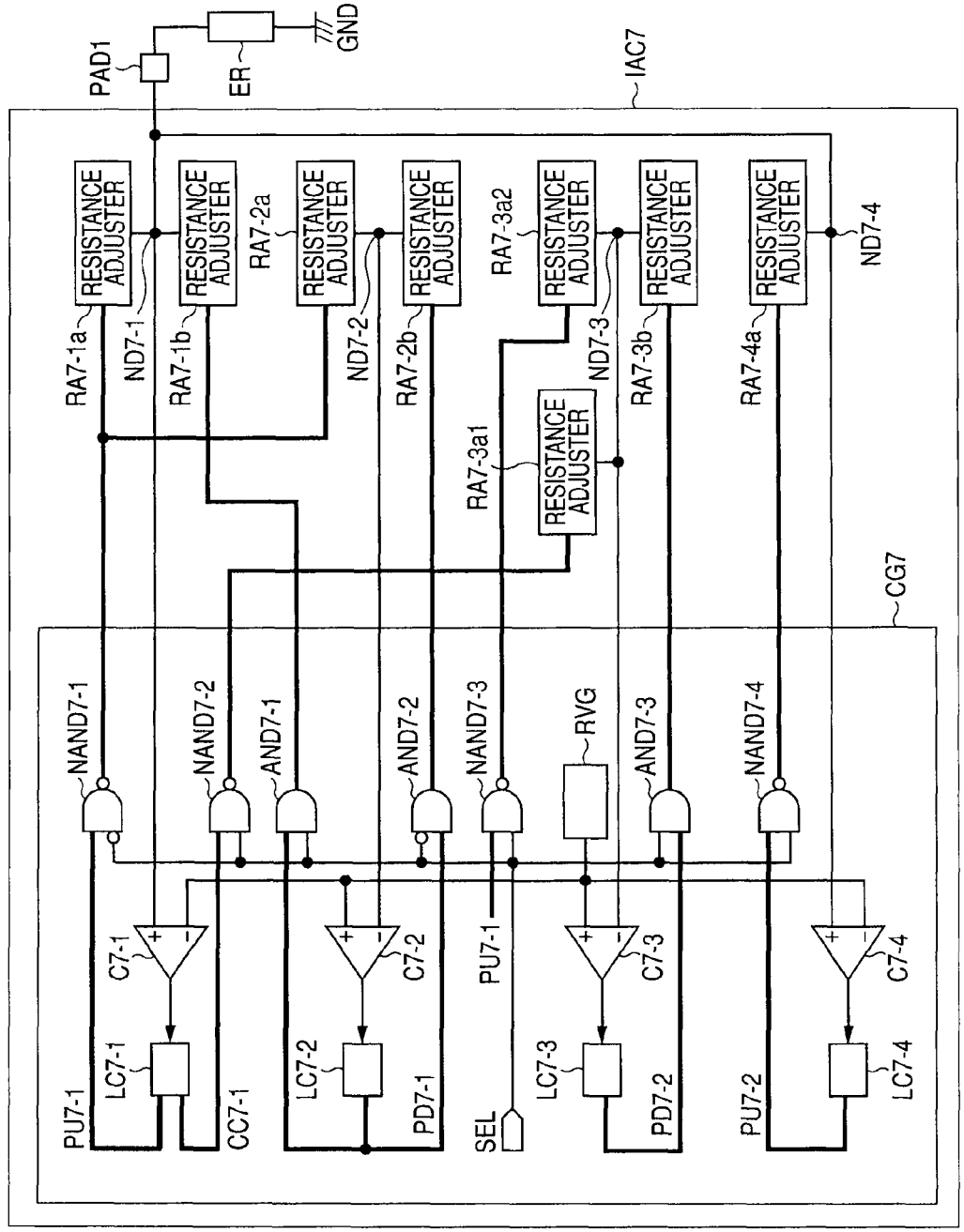
FIG. 18 is a schematic diagram of a semiconductor device as a seventh embodiment.

FIG. 18 is a schematic diagram of a semiconductor device SD7 as a seventh embodiment. The semiconductor device SD7 includes an impedance adjuster IAC7 and the external resistor ER. The impedance adjuster IAC7 includes resistance adjusters RA7-1a, RA7-1b, RA7-2a, RA7-2b, RA7-3a1, RA7-3a2, RA7-3b, RA7-4a, and a code generator CG7.

In a first adjustment stage, the select signal is set to the L-level signal. On the basis of the resistance value of the external resistor ER, the resistance adjusters RA7-1a, RA7-2a, and RA7-2b (pull-up code PU7-1 and pull-down code PD7-1) are adjusted. That is, when the select signal SEL is set as the L-level signal, the NAND circuit NAND7-1 and the AND circuit AND7-2 transmit the pull-up code PU7-1 and the pull-down code PD7-1 to the resistance adjusters RA7-1a, RA7-2a, and RA7-2b.

At this time, the code generator CG7 compares the potential at the node ND7-1 determined by the resistance ratio between the external resistor ER and the resistance adjuster RA7-1a with reference potential and, according to the comparison result, adjusts the pull-up code PU7-1. On the basis of the pull-up code PU7-1, the resistance value of the resistance adjuster RA7-2a is adjusted. Further, the code generator CG7 compares the potential at the node ND7-2 determined by the resistance ratio between the resistance adjusters RA7-2a and RA7-2b with the reference potential, and adjusts the pull-down code PD7-2 with the reference and, and adjusts the pull-down code PD7-2 in accordance with the comparison result.

In a second adjustment stage, the select signal is set to the H-level signal, and the resistance adjusters RA7-1b, RA7-3a1, RA7-3a2, RA7-3b, and RA7-4b (pull-up code PU7-2 and pull-down code PD7-2) are adjusted. That is, when the select signal SEL is set as the H-level signal, the NAND circuits NAND7-2 to NAND 7-4 and the AND circuits AND7-1 and AND7-3 transmit the code signals to the resistance adjusters RA7-1b, RA7-3a1, RA7-3a2, RA7-3b, and RA7-4a.

At this time, on the basis of the pull-down code PD7-1 adjusted in the first adjustment stage, the resistance adjuster RA7-1b is adjusted. On the basis of the pull-up code PU7-1, the resistance adjuster RA7-3a2 is adjusted. On the basis of the correction code CC7-2 obtained by subtracting "1" from the pull-up code PU7-1, the resistance value of the resistance adjuster RA7-3a1 is adjusted.

Next, adjustment of the resistance adjusters RA7-3b and RA7-4a (pull-up code PU7-2/pull-down code PD7-2) is performed. The configuration of the resistance adjusters RA7-

3a1 and RA7-3a2 is that of the first-type resistance adjuster RA-a like the resistance adjusters RA7-1a and RA7-2a. That is, a resistance adjuster RA7-3a (not shown) as a combined resistance of the resistance adjusters RA7-3a1 and RA7-3a2 has a value which is about the half of the resistance value of the external resistor.

By setting the combined resistance value by parallel coupling of the resistance values of the resistance adjusters RA7-3a1 and RA7-3a2, an error from the external resistance value ER can be reduced.

On the basis of the resistance value, the resistance value of the resistance adjuster RA7-3b is adjusted by using the pull-down code PD7-2. The pull-down code PD7-2 is adjusted in accordance with a comparison result between the potential at the node ND7-3 determined by the resistance ratio between the resistance adjuster RA7-3a (combined resistance between RA7-3a1 and RA7-3a2) and the resistance adjuster RA7-3b with the reference potential in the code generator CG7.

The resistance adjuster RA7-4a (pull-up code PU7-2) is adjusted on the basis of the combined resistance of the external resistor ER and the resistance adjuster RA7-1b. That is, in the code generator CG7, the pull-up code PU7-2 is adjusted according to a result of comparison between the potential at the node ND7-4 determined by the resistance ratio between the combined resistance of the external resistor ER and the resistance adjuster RA7-1b1 and the resistance adjuster RA7-4a with reference potential.

Since the external resistor ER is used for resistance adjustment of the resistance adjuster RA7-4a, precision of adjustment to the resistance value of about the half of the resistance value of the external resistor ER becomes higher.

A method of adjusting the resistance value by using the pull-up code/pull-down code is similar to that in the foregoing embodiments and its detailed description will not be repeated.

In the seventh embodiment, the potential determined by the resistance ratio between the external resistor ER and the resistance adjusters is detected by the code generator CG7. The code generator CG7 adjusts a first-type code signal for resistance adjustment in accordance with the detection result, and adjusts the resistance value of each of the resistance adjusters to the external resistor ER. Further, the code generator CG7 adjusts the resistance values of the resistance adjusters coupled in parallel on the basis of the first-type code signal and a correction code and, on the basis of the resistance values of the resistance adjusters coupled in parallel, generates a second-type code signal for adjusting to a resistance value different from the external resistor ER. Further, in the case of adjusting a code on the pull-up side in the code signals of the first and second types, the adjustment is performed by using the external resistor ER.

Consequently, in the seventh embodiment, the first-type code signal (pull-up code PU7-1 and pull-down code PD7-1) for adjustment to the resistance value of the external resistor ER and the second-type code signal (pull-up code PU7-2 and pull-down code PD7-2) which is about the half of the external resistor ER can be generated. Further, since the second-type code signal (pull-up code PU7-2 and pull-down code PD7-2) is adjusted by using the correction code, higher-precision resistance value adjustment can be realized. Further, for the pull-up side code signals (pull-up codes PU7-1, PU7-2) in the first- and second-type code signals, the resistance value of the external resistor ER is directly used to perform adjustment. Therefore, adjustment to the resistance value of the external resistor ER or the half of the resistance value can be performed more precisely.

Eighth Embodiment

Figure 19:
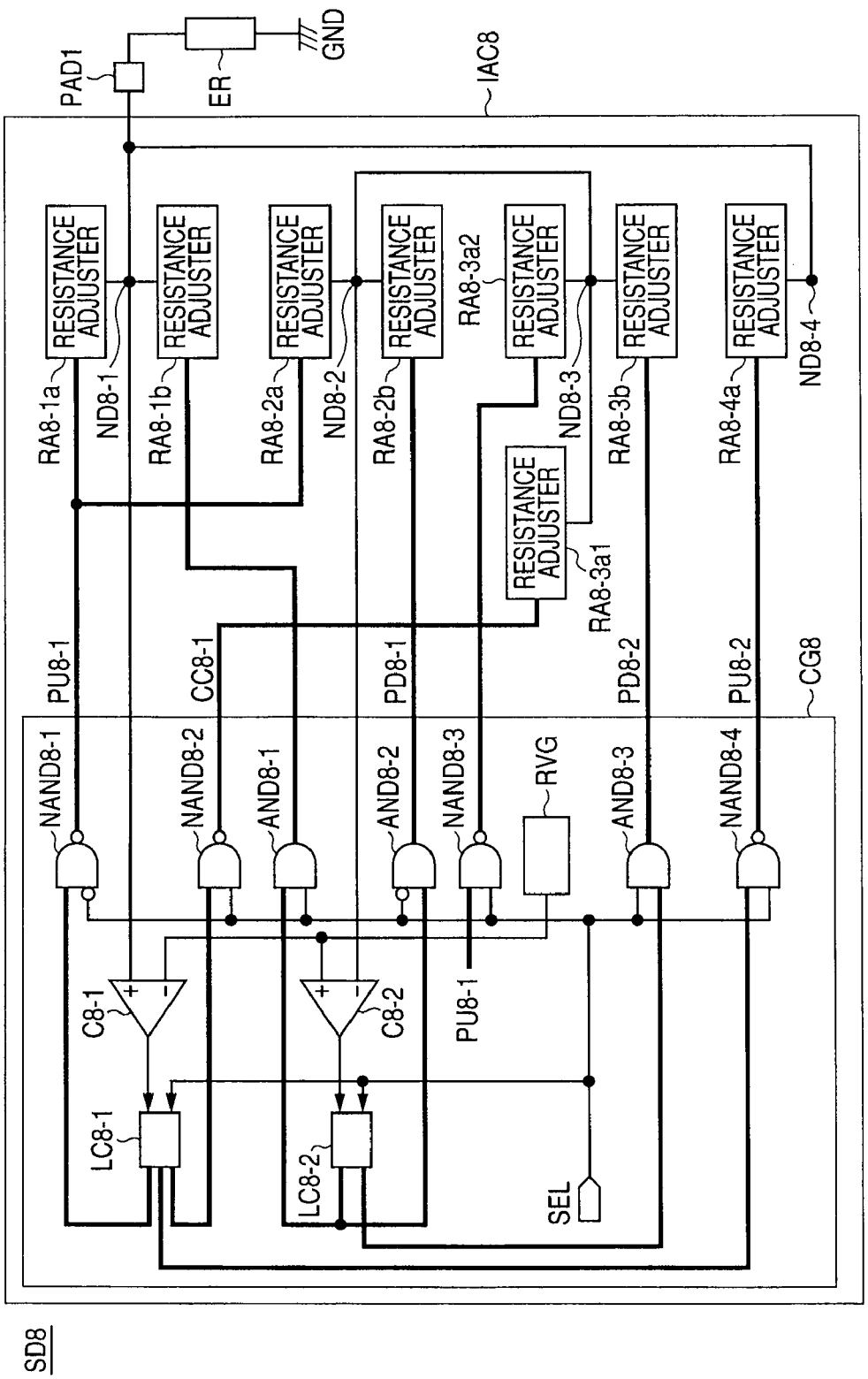
FIG. 19 is a schematic diagram of a semiconductor device as an eighth embodiment.

FIG. 19 is a schematic diagram of an impedance adjuster IAC8 of an eighth embodiment. The impedance adjuster IAC8 includes a semiconductor device SD8 and the external resistor ER. The semiconductor device SD8 has resistance adjusters RA8-1a, RA8-1b, RA8-2a, RA8-2b, RA8-3a1, RA8-3a2, RA8-3b, RA8-4a, and a code generator CG8.

The impedance adjuster IAC8 is a modification of the impedance adjuster IAC7 shown in the seventh embodiment, and the configuration of the code generator CG7 is changed to that of the code generator CG8. Consequently, only the code generator CG8 will be described here, and the detailed description of the unchanged configuration will not be repeated.

In the code generator CG8, by decreasing the number of comparison circuits in the code generator CG7, the circuit area is reduced. Specifically, in the pull-down code system, a comparison circuit C8-2 and a logic circuit LC8-2 are shared. In the pull-up code system, a comparison circuit C8-1 and a logic circuit LC8-1 are shared. By switching the connection by the select signal SEL, two kinds of resistance values are adjusted separately. Although the details will not be described, the sharing is performed by controlling NAND circuits NAND8-1, NAND8-2, NAND8-3, and NAND8-4, and the NAND circuits AD8-1, AD8-2, and AD8-3.

In the eighth embodiment, in addition to the effect of the seventh embodiment, by sharing the comparison circuits by a select signal, the area can be reduced.

Ninth Embodiment

Figure 20:
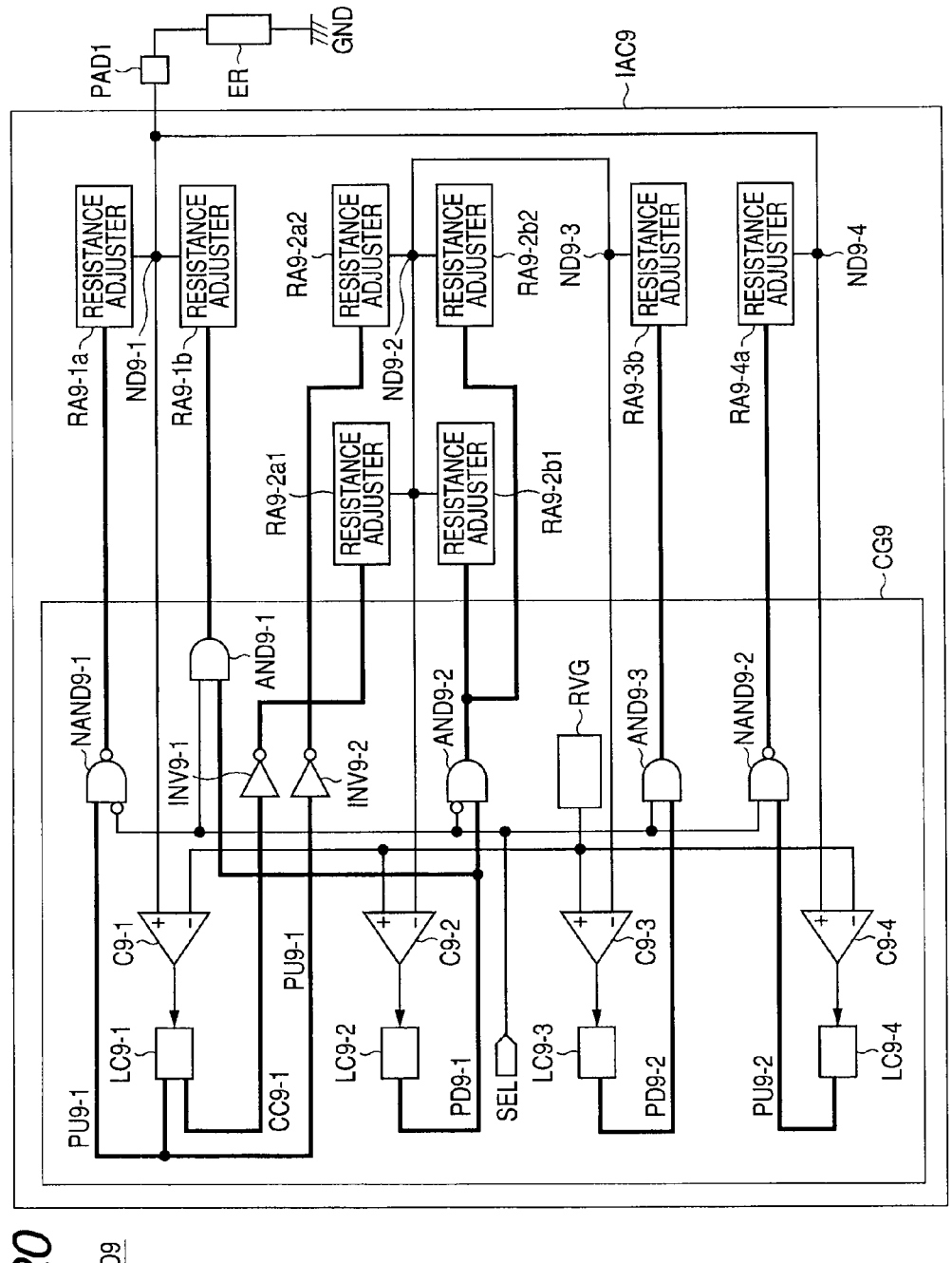
FIG. 20 is a schematic diagram of a semiconductor device SD9 as a ninth embodiment.

FIG. 20 is a schematic diagram of a semiconductor device SD9 as a ninth embodiment. The semiconductor device SD9 includes an impedance adjuster IAC9 and the external resistor ER. The impedance adjuster IAC9 includes resistance adjusters RA9-1a, RA9-1b, RA9-2a1, RA9-2b1, RA9-2a2, RA9-2b2, RA9-3b, RA9-4a, and a code generator CG9.

In a first adjustment stage, the select signal is set to the L-level signal. On the basis of the resistance value of the external resistor ER, the resistance adjusters RA9-1a, RA9-2a1, RA9-2b1, RA9-2a2, and RA9-2b2 (pull-up code PU9-1 and pull-down code PD9-1) are adjusted. That is, when the select signal SEL is set as the L-level signal, the NAND circuit NAND9-1, an AND circuit AND9-2, and inverters INV9-1 and INV9-2 transmit a pull-up code PU9-1, a pull-down code PD9-1, and a correction code CC9-1 to the resistance adjusters RA9-1a, RA9-2a1, RA9-2b1, RA9-2a2, and RA9-2b2.

First, the code generator CG9 compares the potential at the node ND9-1 determined by the resistance ratio between the external resistor ER and the resistance adjuster RA9-1a with reference potential and, according to the comparison result, adjusts the pull-up code PU9-1. On the basis of the pull-up code PU9-1, the resistance value of the resistance adjuster RA9-2a2 is adjusted. On the basis of the correction code CC9-1 obtained by subtracting 1 from the pull-up code PU9-1, the resistance value of the resistance adjuster RA9-2a1 is adjusted.

Next, adjustment of the resistance adjusters RA9-2b1 and RA9-2b2 (pull-down code PD9-1) is performed. Specifically, the code generator CG9 compares the potential at the node ND9-2 determined by the resistance ratio between the combined resistance of the resistance adjusters RA9-2a1 and RA9-2a2 and the combined resistance of the resistance adjusters RA9-2b1 and RA9-2b2 with reference potential and, according to the comparison result, adjusts the pull-down code PD9-1.

In a second adjustment stage, the select signal is set to the H-level signal, and the resistance adjusters RA9-3b and RA9-4a (pull-up code PU9-2 and pull-down code PD9-2) are adjusted. That is, when the select signal is the H-level signal, the NAND circuit NAND9-2, the AND circuit AND9-3, and inverters INV9-1 to INV9-2 transmit the code signals to the resistance adjusters RA9-1b, RA9-2a1, RA9-2a2, RA9-3b, and RA9-4a.

At this time, adjustment of the resistance adjusters RA9-3b and RA9-4a (pull-up code PU9-2/pull-down code PD9-2) is performed. The configuration of the resistance adjusters RA9-2a1 and RA9-2a2 is that of the first-type resistance adjuster RA-a like the resistance adjuster RA9-1a. That is, a resistance adjuster RA9-2a (not shown) as a combined resistance of the resistance adjusters RA9-2a1 and RA9-2a2 has a value which is about the half of the resistance value of the external resistor.

By setting the combined resistance value by parallel coupling of the resistance values of the resistance adjusters RA9-2a1 and RA9-2a2, an error from the external resistance value ER can be reduced.

On the basis of the resistance value, the resistance value of the resistance adjuster RA9-3b is adjusted by using the pull-down code PD9-2. The pull-down code PD9-2 is adjusted in accordance with a comparison result between the potential at the node ND9-3 determined by the resistance ratio between the resistance adjuster RA9-2a (combined resistance between RA9-2a1 and RA9-2a2) and the resistance adjuster RA9-3b with the reference potential in the code generator CG9.

The resistance adjuster RA9-4a (pull-up code PU9-2) is adjusted on the basis of the combined resistance of the external resistor ER and the resistance adjuster RA9-1b. That is, in the code generator CG9, the pull-up code PU9-2 is adjusted according to a result of comparison between the potential at the node ND9-4 determined by the resistance ratio between the combined resistance of the external resistor ER and the resistance adjuster RA9-1b1 and the resistance adjuster RA9-4a with reference potential.

Since the external resistor ER is used for resistance adjustment of the resistance adjuster RA9-4a, precision of adjustment to the resistance value of the external resistor ER becomes higher.

A method of adjusting the resistance value by using the pull-up code/pull-down code is similar to that in the foregoing embodiments and its detailed description will not be repeated.

In the ninth embodiment, the potential determined by the resistance ratio between the external resistor ER and the resistance adjusters is detected by the code generator CG9. The code generator CG9 adjusts a first-type code signal for resistance adjustment in accordance with the detection result, and adjusts the resistance value of each of the resistance adjusters to the external resistor ER. Further, the code generator CG9 adjusts the resistance values of the resistance adjusters coupled in parallel on the basis of the first-type code signal and a correction code and, on the basis of the resistance values of the resistance adjusters coupled in parallel, generates a second-type code signal for adjusting to a resistance value different from the external resistor ER. Further, in the case of adjusting a code on the pull-up side in the code signals of the first and second types, the adjustment is performed by using the external resistor ER.

Consequently, in the ninth embodiment, the first-type code signal (pull-up code PU9-1 and pull-down code PD9-1) for adjustment to the resistance value of the external resistor ER and the second-type code signal (pull-up code PU9-2 and pull-down code PD9-2) which is adjusted to about the half of the external resistor ER can be generated. Further, since the pull-down codes PD9-1 and PD9-2 are adjusted by using the correction code, higher-precision resistance value adjustment can be realized. Further, for the pull-up side code signals (pull-up codes PU9-1, PU9-2) in the first- and second-type code signals, the resistance value of the external resistor ER is directly used to perform adjustment. Therefore, adjustment to the resistance value of the external resistor ER or the half of the resistance value can be performed more precisely.

Tenth Embodiment

Figure 21:
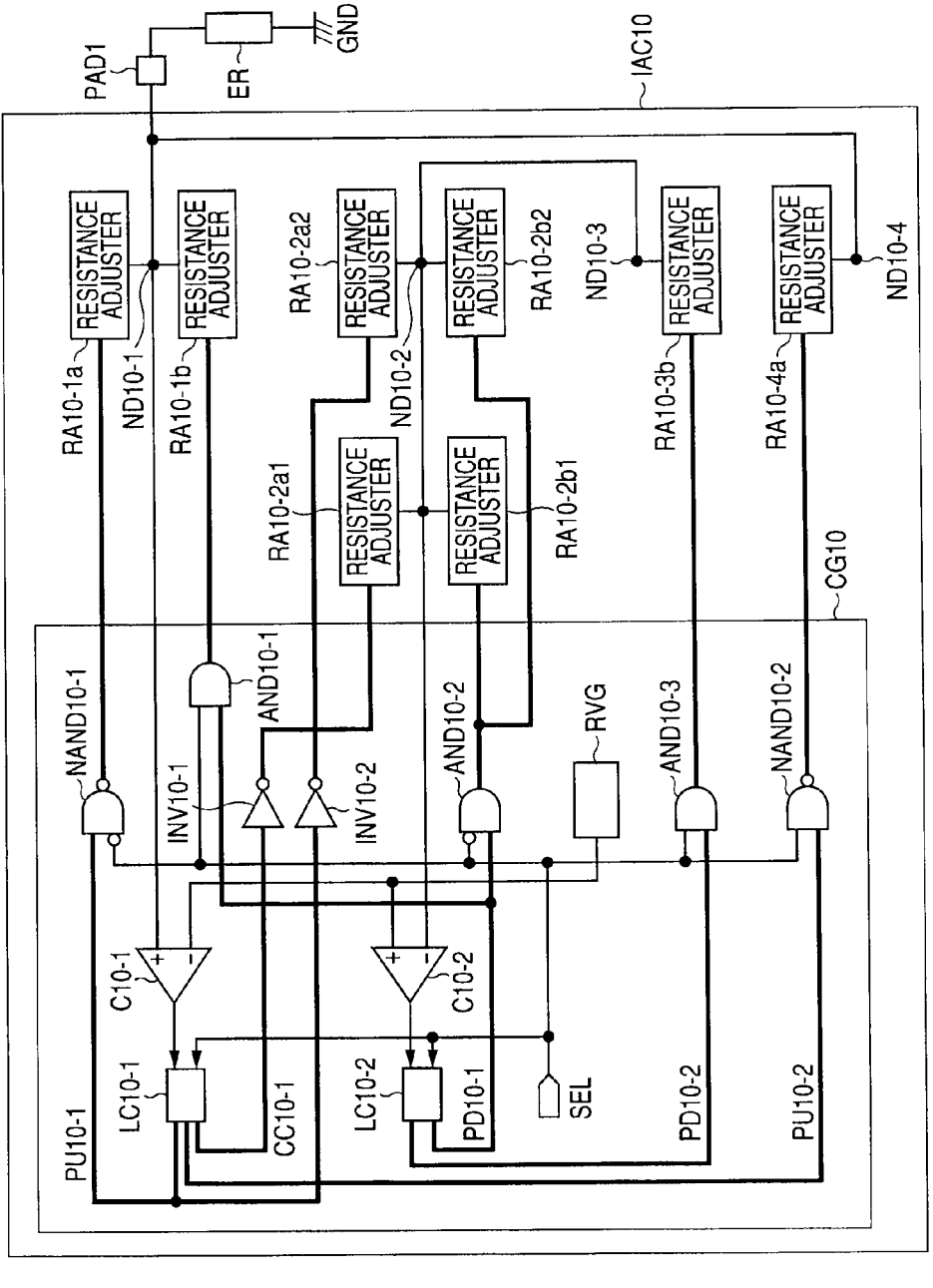
FIG. 21 is a schematic diagram of a semiconductor device SD10 as a tenth embodiment.

FIG. 21 is a schematic diagram of a semiconductor device SD10 as a tenth embodiment. The semiconductor device SD10 includes an impedance adjuster IAC10 and the external resistor ER. The impedance adjuster IAC10 includes resistance adjusters RA10-1a, RA10-1b, RA10-2a1, RA10-2b1, RA10-2a2, RA10-2b2, RA10-3b, RA10-4a, and a code generator CG10.

The impedance adjuster IAC10 is a modification of the impedance adjuster IAC9 in the ninth embodiment. The configuration of the code generator CG9 is changed to the configuration of the code generator CG10. Consequently, only the code generator CG10 will be described, and the detailed description of the unchanged configuration will not be repeated.

In the code generator CG10, by decreasing the number of comparison circuits in the code generator CG10, the circuit area is reduced. Specifically, in the pull-down code system, a comparison circuit C10-2 and a logic circuit LC10-2 are shared. In the pull-up code system, a comparison circuit C10-1 and a logic circuit LC10-1 are shared. By switching the operation of the comparison circuits and the logic circuits by the select signal SEL, two kinds of resistance values are adjusted separately. Concretely, by using the selector signal SEL, NAND circuits NAND10-1, NAND10-2, and AND circuits AND10-1, AND10-2, and AND10-3. Inverter circuits INV10-1 and INV10-2 transmit a correction code CC9-1 and a pull-up code 9-1 to the corresponding resistance adjusters irrespective of the selector signal SEL.

In the tenth embodiment, in addition to the effect of the ninth embodiment, the comparison circuits are shared by using complementary select signals, so that the area can be reduced.

Eleventh Embodiment

Figure 22:
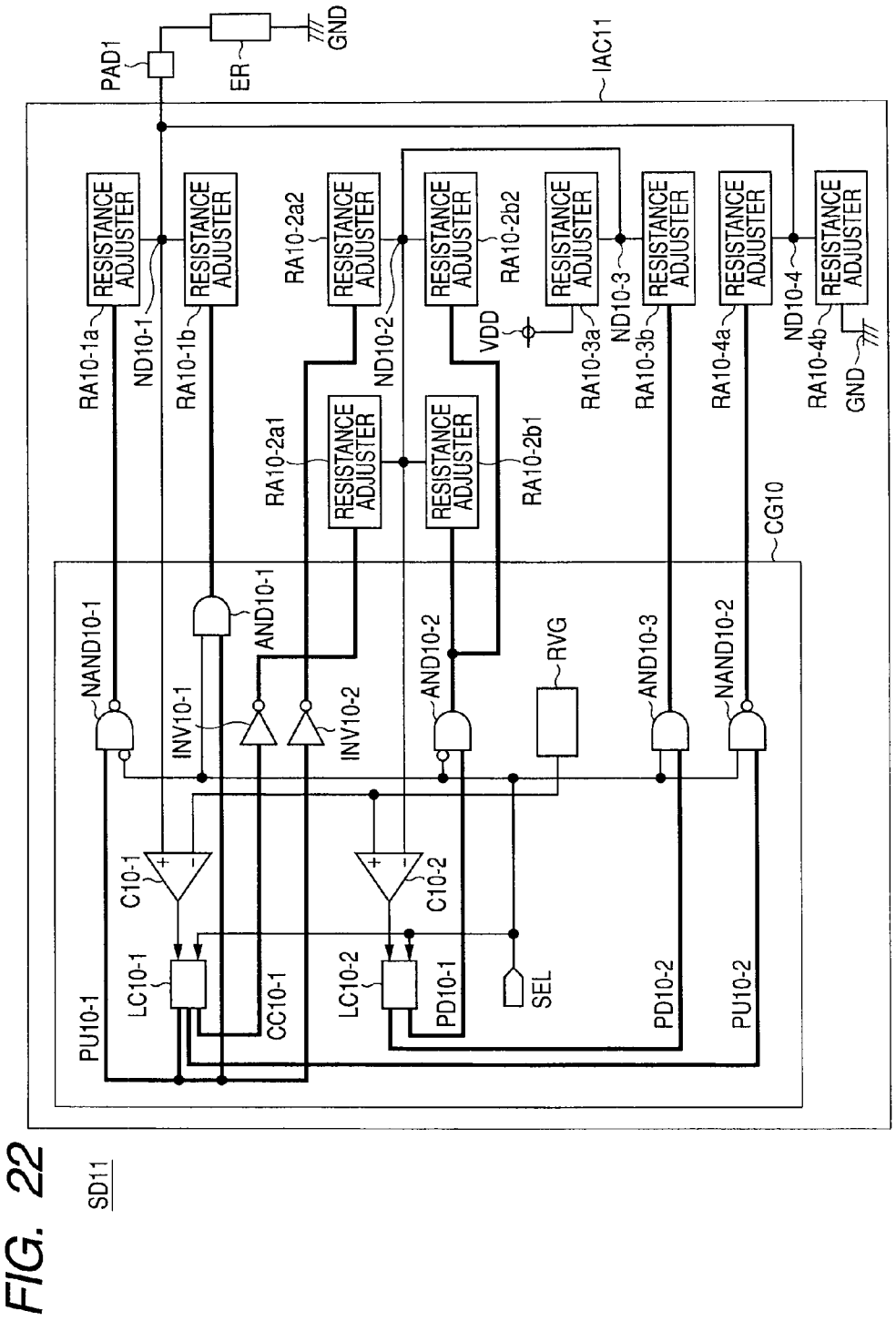
FIG. 22 is a schematic diagram of a semiconductor device SD11 as an eleventh embodiment.

FIG. 22 is a schematic diagram of a semiconductor device SD11 as an eleventh embodiment. The semiconductor device SD11 is a modification of the semiconductor device SD10, in which simplification of layout is considered. In the semiconductor device SD11, the same reference numerals are designated to the elements corresponding to those of the semiconductor device SD10 and their description will not be repeated.

The semiconductor device SD11 is obtained by adding resistance adjusters RA10-3a and RA10-4b to the semiconductor device SD10. The code signal of the resistance adjuster RA10-3a is fixed to the power source voltage VDD (H-level signal), and the code signal of the resistance adjuster RA10-4b is fixed to the reference voltage GND (L-level signal) and is in the off state.

The reason why the dummy resistance adjusters RA10-3*a* and RA10-4*b* are added is to dispose the first-type and second-type resistance adjusters in pairs. That is, by setting repetitive layout, the layout is simplified.

The simplification of the layout by adding the dummy resistance adjusters can be also applied to the foregoing embodiments.

By applying the present invention to the impedance adjuster, adjustment with the external resistance can be realized.

What is claimed is:

1. A semiconductor device comprising:
a pad for coupling an external resistor;
a first first-type resistance adjuster whose resistance value is adjusted according to a first code signal;
a second first-type resistance adjuster whose resistance value is adjusted according to the first code signal;
a third first-type resistance adjuster whose resistance value is adjusted according to a first correction code signal;
a first second-type resistance adjuster whose resistance value is adjusted according to a second code signal;
a second second-type resistance adjuster whose resistance value is adjusted according to the second code signal; and
a code generator for comparing potential of a first node determined by a resistance ratio between the external resistor and the first first-type resistance adjuster with a reference potential, adjusting the first code signal according to a comparison result, adjusting a first correction code based on the first code signal, comparing potential of a second node determined by combined resistance between the second first-type resistance adjuster and the third first-type resistance adjuster and combined resistance between the first second-type resistance adjuster and the second second-type resistance adjuster with reference potential, and adjusting a second code signal according to a comparison result, wherein
a resistance value of the external resistor is between a first resistance value of the first first-type resistance adjuster when adjusted the resistance value according to the first code signal and a second resistance value of the first first-type resistance adjuster when adjusted the resistance value according to the first correction code signal.

2. The semiconductor device according to claim 1, wherein in the first-type resistance adjuster, a plurality of resistance adjustment elements in each of which a P-channel-type MOS transistor and a resistive element are coupled in series are coupled in parallel, the P-channel-type MOS transistor is on/off controlled in accordance with the corresponding code signal, and a resistance value is adjusted, and
wherein in the second-type resistance adjuster, a plurality of resistance adjustment elements in each of which an N-channel-type MOS transistor and a resistive element are coupled in series are coupled in parallel, the N-channel-type MOS transistor is on/off controlled in accordance with the corresponding code signal, and a resistance value is adjusted.

3. The semiconductor device according to claim 1 further comprising an output driver whose resistance value is adjusted according to each of code signals adjusted in the code generator.

4. The semiconductor device according to claim 1,
wherein each resistance adjuster includes parallel switches configured to open or close in accordance with the corresponding code signal.

5. A semiconductor device comprising:
a pad for coupling an external resistor;
a first first-type resistance adjuster whose resistance value is adjusted according to a first code signal;
a second first-type resistance adjuster whose resistance value is adjusted according to the first code signal;
a third first-type resistance adjuster whose resistance value is adjusted according to the first code signal;
a fourth first-type resistance adjuster whose resistance value is adjusted according to the first code signal;
a first second-type resistance adjuster whose resistance value is adjusted according to a second code signal;
a second second-type resistance adjuster whose resistance value is adjusted according to a third code signal;
a third second-type resistance adjuster whose resistance value is adjusted according to the third code signal;
a fifth first-type resistance adjuster whose resistance value is adjusted according to a fourth code signal; and
a code generator for comparing potential of a first node determined by a resistance ratio between the external resistor and the first first-type resistance adjuster with a reference potential, adjusting the first code signal according to a comparison result, comparing potential of a second node determined by a resistance ratio between the second first-type resistance adjuster and the first second-type resistance adjuster with reference potential, adjusting a second code signal according to a comparison result, comparing a potential of a third node determined by a resistance ratio between a combined resistance between the third first-type resistance adjuster and the fourth first-type resistance adjuster and the second second-type resistance adjuster with reference potential, adjusting a third code signal according to a comparison result, comparing potential of a fourth node determined by a resistance ratio between the fifth first-type resistance adjuster and the fourth second-type resistance adjuster with reference potential, and adjusting a fourth code signal according to a comparison result.

6. A semiconductor device comprising:
a pad for coupling an external resistor;
a first first-type resistance adjuster whose resistance value is adjusted according to a first code signal;
a second first-type resistance adjuster whose resistance value is adjusted according to the first code signal;
a third first-type resistance adjuster whose resistance value is adjusted according to the first code signal;
a fourth first-type resistance adjuster whose resistance value is adjusted according to a first correction code signal;
a first second-type resistance adjuster whose resistance value is adjusted according to a second code signal;
a second second-type resistance adjuster whose resistance value is adjusted according to the second code signal;
a third second-type resistance adjuster whose resistance value is adjusted according to a third code signal;
a fourth second-type resistance adjuster whose resistance value is adjusted according to a second correction code signal;
a fifth first-type resistance adjuster whose resistance value is adjusted according to a fourth code signal; and
a code generator for comparing potential of a first node determined by a resistance ratio between the external resistor and the first first-type resistance adjuster with a reference potential, adjusting the first code signal according to a comparison result, adjusting the first correction code based on the first code signal, comparing potential of a second node determined by a resistance ratio between the second first-type resistance adjuster and the first second-type resistance adjuster with reference potential, adjusting a second code signal according to a comparison result, adjusting the second correction code based on the second code signal, comparing a potential of a third node determined by a resistance ratio between a combined resistance between the third first-type resistance adjuster and the fourth first-type resistance adjuster and the third second-type resistance adjuster with reference potential, adjusting the third code signal according to a comparison result, comparing potential of a fourth node determined by a resistance ratio between the fifth first-type resistance adjuster and combined resistance between the second second-type resistance adjuster and the fourth second-type resistance adjuster with reference potential, and adjusting the fourth code signal according to a comparison result.

7. A semiconductor device comprising:
a pad for coupling an external resistor;
a first first-type resistance adjuster whose resistance value is adjusted according to a first code signal;
a second first-type resistance adjuster whose resistance value is adjusted according to the first code signal;
a third first-type resistance adjuster whose resistance value is adjusted according to the first code signal;
a fourth first-type resistance adjuster whose resistance value is adjusted according to a first correction code signal;
a first second-type resistance adjuster whose resistance value is adjusted according to a second code signal;
a second second-type resistance adjuster whose resistance value is adjusted according to the second code signal;
a third second-type resistance adjuster whose resistance value is adjusted according to a third code signal;
a fifth first-type resistance adjuster whose resistance value is adjusted according to a fourth code signal; and
a code generator for comparing potential of a first node determined by a resistance ratio between the external resistor and the first first-type resistance adjuster with a reference potential, adjusting the first code signal according to a comparison result, adjusting the second correction code based on the first code signal, comparing potential of a second node determined by a resistance ratio between the second first-type resistance adjuster and the second first-type resistance adjuster with reference potential, adjusting a second code signal according to a comparison result, comparing a potential of a third node determined by a resistance ratio between a combined resistance between the third first-type resistance adjuster and the fourth first-type resistance adjuster and the third second-type resistance adjuster with reference potential, adjusting the third code signal according to a comparison result, comparing potential of a fourth node determined by a resistance ratio between the fifth first-type resistance adjuster and combined resistance between the external resistor and the first second-type resistance adjuster with reference potential, and adjusting the fourth code signal according to a comparison result.

8. A semiconductor device comprising:
a pad for coupling an external resistor;
a first first-type resistance adjuster whose resistance value is adjusted according to a first code signal;
a second first-type resistance adjuster whose resistance value is adjusted according to the first code signal;
a third first-type resistance adjuster whose resistance value is adjusted according to a first correction code signal;
a first second-type resistance adjuster whose resistance value is adjusted according to a second code signal;
a second second-type resistance adjuster whose resistance value is adjusted according to the second code signal;
a third second-type resistance adjuster whose resistance value is adjusted according to a second code signal;
a fourth second-type resistance adjuster whose resistance value is adjusted according to a third code signal;
a fourth first-type resistance adjuster whose resistance value is adjusted according to a fourth code signal; and
a code generator for comparing potential of a first node determined by a resistance ratio between the external resistor and the first first-type resistance adjuster with a reference potential, adjusting the first code signal according to a comparison result, adjusting the second correction code based on the first code signal, comparing potential of a second node determined by a resistance ratio between combined resistance between the second first-type resistance adjuster and the third first-type resistance adjuster and combined resistance between the second second-type resistance adjuster and the third second-type resistance adjuster with reference potential, adjusting a second code signal according to a comparison result, comparing a potential of a third node determined by a resistance ratio between a combined resistance between the second first-type resistance adjuster and the third first-type resistance adjuster and the fourth second-type resistance adjuster with reference potential, adjusting the third code signal according to a comparison result, comparing potential of a fourth node determined by a resistance ratio between the fourth first-type resistance adjuster and combined resistance between the external resistor and the first second-type resistance adjuster with reference potential, and adjusting the fourth code signal according to a comparison result.

* * * * *